US011753517B2

(12) United States Patent
Hanft

(10) Patent No.: US 11,753,517 B2
(45) Date of Patent: Sep. 12, 2023

(54) DISPENSABLE POLYIMIDE AEROGEL PREPOLYMER, METHOD OF MAKING THE SAME, METHOD OF USING THE SAME, AND SUBSTRATE COMPRISING PATTERNED POLYIMIDE AEROGEL

(71) Applicant: Raytheon Company, Waltham, MA (US)

(72) Inventor: Thomas A. Hanft, Allen, TX (US)

(73) Assignee: RAYTHEON COMPANY, Waltham, MA (US)

( * ) Notice: Subject to any disclaimer, the term of this patent is extended or adjusted under 35 U.S.C. 154(b) by 730 days.

(21) Appl. No.: 16/712,663

(22) Filed: Dec. 12, 2019

(65) Prior Publication Data

US 2021/0179800 A1    Jun. 17, 2021

(51) Int. Cl.
| | | |
|---|---|---|
| C08J 9/28 | (2006.01) | |
| C08L 33/06 | (2006.01) | |
| C08L 35/04 | (2006.01) | |
| C08L 77/10 | (2006.01) | |
| C08L 79/08 | (2006.01) | |
| H01L 21/56 | (2006.01) | |
| H01L 23/29 | (2006.01) | |

(52) U.S. Cl.
CPC ............ *C08J 9/286* (2013.01); *C08L 33/064* (2013.01); *C08L 35/04* (2013.01); *C08L 77/10* (2013.01); *C08L 79/08* (2013.01); *H01L 21/565* (2013.01); *H01L 23/293* (2013.01); *C08J 2379/08* (2013.01); *C08L 2203/206* (2013.01); *C08L 2666/20* (2013.01)

(58) Field of Classification Search
CPC .... C08L 2203/20; C08L 79/08; H01M 4/386; H01G 11/84; C08J 9/286; C08J 2379/08
See application file for complete search history.

(56) References Cited

U.S. PATENT DOCUMENTS

| | | | |
|---|---|---|---|
| 3,179,630 A | 4/1965 | Endrey | |
| 3,562,217 A | 2/1971 | Zalewski et al. | |
| 3,622,525 A | 11/1971 | Miller | |
| 3,701,756 A | 10/1972 | Carleton et al. | |
| 3,884,880 A | 5/1975 | Disque et al. | |
| 3,952,084 A | 4/1976 | Edelman et al. | |
| RE29,134 E | 2/1977 | Edelman et al. | |
| 4,108,810 A | 8/1978 | Baker | |
| 4,338,427 A | 7/1982 | Maekawa et al. | |
| 4,395,531 A | 7/1983 | Toyoda et al. | |
| 5,177,176 A | 1/1993 | Auman | |
| 5,231,162 A | 7/1993 | Nagata | |
| 5,260,483 A | 11/1993 | Davis et al. | |
| 5,484,818 A | 1/1996 | De Vos et al. | |
| 5,858,457 A | 1/1999 | Brinker et al. | |
| 5,869,545 A | 2/1999 | Biesmans et al. | |
| 5,942,553 A | 8/1999 | Biesmans et al. | |
| 5,962,539 A * | 10/1999 | Perrut | B01J 13/0091 |
| | | | 521/64 |
| 5,990,184 A | 11/1999 | Biesmans | |
| 6,399,669 B1 | 6/2002 | Suzuki et al. | |
| 6,596,467 B2 | 7/2003 | Gallagher et al. | |
| 7,022,377 B2 | 4/2006 | Kanada et al. | |
| 7,074,880 B2 | 7/2006 | Rhine et al. | |
| 7,078,477 B2 | 7/2006 | Oguro et al. | |
| 7,193,009 B2 | 3/2007 | Amou et al. | |
| 8,226,839 B1 | 7/2012 | Reed | |
| 8,231,692 B2 | 7/2012 | Goetz et al. | |
| 8,319,112 B2 | 11/2012 | Bedinger et al. | |
| 8,653,673 B2 | 2/2014 | Hallock et al. | |
| 8,945,677 B2 | 2/2015 | Zafiropoulos et al. | |
| 8,974,903 B2 | 3/2015 | Meador et al. | |
| 9,292,792 B1 | 3/2016 | Pedersen et al. | |
| 2003/0022524 A1 | 1/2003 | Smith et al. | |
| 2004/0071878 A1 | 4/2004 | Schuhmacher et al. | |
| 2007/0042609 A1 | 2/2007 | Senkevich et al. | |
| 2011/0061914 A1 | 3/2011 | Sekito | |
| 2012/0067871 A1 | 3/2012 | Sherrer et al. | |

(Continued)

FOREIGN PATENT DOCUMENTS

| | | |
|---|---|---|
| EP | 0 299 865 A2 | 1/1989 |
| GB | 1105437 | 3/1968 |

OTHER PUBLICATIONS

International Search Report for corresponding International Application No. PCT/US2020/051296, filed Sep. 17, 2020, International Search Report dated Dec. 2, 2020 and dated Dec. 10, 2020 (5 pgs.).
Written Opinion of the International Searching Authority for corresponding International Application No. PCT/US2020/051296, filed Sep. 17, 2020, Written Opinion of the International Searching Authority dated Dec. 10, 2020 (8 pgs.).
Akimov, Yu K.; "Fields of Application of Aerogels (Review)"; Instruments and Experimental Techniques; vol. 46; No. 3 (2003); pp. 287-299.
Alvino, William M. et al; "Polyimides from Diisocyanates, Dianhydrides, and Their Dialkyl Esters"; Journal of Applied Polymer Science; vol. 22; 1978; pp. 1983-1990.

(Continued)

*Primary Examiner* — Gregory Listvoyb
(74) *Attorney, Agent, or Firm* — LEWIS ROCA ROTHGERBER CHRISTIE LLP

(57) ABSTRACT

A method for manufacturing a patterned polyimide aerogel film on a substrate includes: dispensing a polyimide prepolymer sol onto a first portion of a surface of a substrate, a second portion of the surface of the substrate being substantially free of the polyimide prepolymer sol; forming a patterned film of a polyimide prepolymer gel on the substrate from the polyimide prepolymer sol; drying the polyimide prepolymer gel to form a patterned film of a polyimide prepolymer aerogel on the substrate; and curing the polyimide prepolymer aerogel on the substrate to form the patterned polyimide aerogel film on the first portion of the surface of the substrate, the second portion of the surface of the substrate being substantially free of the patterned polyimide aerogel film.

10 Claims, 14 Drawing Sheets

(56) References Cited

U.S. PATENT DOCUMENTS

| | | | |
|---|---|---|---|
| 2012/0134909 | A1 | 5/2012 | Leventis et al. |
| 2012/0189782 | A1 | 7/2012 | Zafiropoulos et al. |
| 2012/0237677 | A1 | 9/2012 | Korampally et al. |
| 2013/0075795 | A1 | 3/2013 | Hauhe et al. |
| 2013/0310486 | A1 | 11/2013 | Kawakusu |
| 2013/0338247 | A1 | 12/2013 | Leventis et al. |
| 2014/0272358 | A1 | 9/2014 | Meador et al. |
| 2014/0322122 | A1 | 10/2014 | Leventis et al. |
| 2014/0350134 | A1 | 11/2014 | Rodman et al. |
| 2015/0004862 | A1 | 1/2015 | Kuo et al. |
| 2015/0141544 | A1 | 5/2015 | Meador et al. |
| 2015/0145106 | A1 | 5/2015 | Zafiropoulos et al. |
| 2017/0137593 | A1 | 5/2017 | Rodman et al. |

OTHER PUBLICATIONS

Anderson, Herbert R. et al.; "Polyimide-Substrate Bonding Studies Using γ-APS Coupling Agent"; IEEE Transactions on Components, Hybrids, and Manufacturing Technology; vol. CHMT-9; No. 4; Dec. 1986; pp. 364-369.
Arkles, Barry; "Silane Coupling Agents: Connecting Across Boundaries"; Version 2.0; Gelest, Inc. Catalog.; 2006; 60 pp.
Armini, S. et al.; "Pore Sealing of Porous Ultralow-k Dielectrics by Self-Assembled Monolayers Combined with Atomic Layer Deposition"; ECS Solid State Letters, vol. 1 (2); 2012; pp. 42-44.
Attia, S.M. et al.; "Review of Sol-Gel Derived Coatings: Process, Techniques and Optical Applications"; J. Mater. Sci. Technol., vol. 18; No. 3 (2002); pp. 211-218.
Baklanov, Mikhail R.; et al; "Porous low dielectric constant materials for microelectronics"; Phil. Trans. R. Soc. A; vol. 364; 2006; pp. 201-215.
Barikani, Mehdi; "Polyimides Derived from Diisocyanates"; Iranian Polymer Journal; vol. 11; No. 4; 2002; pp. 215-236.
Barikani, Mehdi et al.; "Preparation and Properties of Polyimides and Polyamide-imides from Diisocyanates"; Journal of Polymer Science: Part A: Polymer Chemistry; vol. 37; 1999; pp. 2245-2250.
Bian, Qiumei et al.; "Micromachining of polyurea aerogel using femtosecond laser pulses"; Journal of Non-Crystalline Solids; vol. 357; 2011; pp. 186-193.
Biesmans, G. et al.; "Polyurethane based organic aerogels and their transformation into carbon aerogels"; Journal of Non-Crystalline Solids; vol. 225 (1998); pp. 64-68.
Brinker, C. Jeffrey et al.; "Sol-Gel Science: The Physics and Chemistry of Sol-Gel Processing; Film Formation"; Chapter 13; Academic Press, Inc.; 1990; 28pp.
Brinker, C. J. et al.; "Fundamentals of Sol-Gel Dip Coating"; Thin Solid Films; vol. 201; 1991; pp. 97-108.
Burger, T. et al; "Aerogels: Production, Modification and Applications", Ber. Bunsenges. Phys. Chem.; 102 (1998); No. 11; pp. 1523-1528.
Carleton, Peter S. et al.; "The Formation of Polyimides from Anhydrides and Isocyanates"; Journal of Applied Polymer Science; vol. 16; 1972; pp. 2983-2989.
Chang, Chih-Chieh et al.; "Pore sealing of mesoporous silica low-k dielectrics by oxygen and argon plasma treatments"; Microelectronic Engineering; vol. 86; 2009; pp. 2241-2246.
Chapin, J. T. et al.; "Synthesis of Polyamides, Polyamide-imides, and Polyimides from 4,4' Methylene Bis (Isocyanato Benzene)"; Polymer Preprints; vol. 21; 1980; pp. 130-131.
Chidambareswarapattar, C. et al.; "One-step Polyimide Aerogels from Anhydrides and Isocyanates"; Polymer Preprints; vol. 51(2); (2010); pp. 638-639.
Chidambareswarapattar, C. et al., "One-step room-temperature synthesis of fibrous polyimide aerogels from anhydrides and isocyanates and conversion to isomorphic carbons"; Journal of Materials Chemistry; vol. 20 (Sep. 22, 2010); pp. 9666-9678.
Chidambareswarapattar, C. et al.; "Robust monolithic multiscale nanoporous polyimides and conversion to isomorphic carbons"; RSC Adv.; vol. 3 (2013); pp. 26459-26469.

Chisca, Stefan et al.; "Dielectric behavior of some aromatic polyimide films", European Polymer Journal; vol. 47; 2011; pp. 1186-1197.
De Abajo, J. et al.; "Processable Aromatic Polyimides"; *Advances in Polymer Science*, vol. 140; Progress in Polyimide Chemistry I; 1999; pp. 23-59.
De Abajo, Javier et al; "Polyimides" in *Handbook of Polymer Synthesis*, $2^{nd}$ Edition, New York, Marcel Dekker, 2005, Ch. 9, 541-602.
Farrissey, W.J. et al.; "Preparation of Polyimide Foam"; Journal of Applied Polymer Science; vol. 14; 1970; pp. 1581-1586.
Fink, J.K.; "Poly(imide)s" in *High Performance Polymers*, Chapter 15, Elsevier Science and Technology Books, Inc., 2008; pp. 475-519.
Fricke, Jochen et al.; "Aerogels"; J. Am. Ceram. Soc.; 75 (8); 1992; pp. 2027-2036.
Ghatge, N.D. et al.; "Polyimide Copolymers by Condensation of One Dianhydride and Two Diisocyanates"; Die Angewandte Makrornolekulare Chemie; vol. 66; 1978; pp. 67-73.
Ghatge, N.D. et al.; "Polyimides from Diisocyanates and Dianhydride"; Journal of Polymer Science: Polymer Chemistry Edition; vol. 18; 1980; pp. 1905-1909.
Guo, Haiquan et al.; "Polyimide Aerogels Cross-Linked through Amine Functionalized Polyoligomeric Silsesquioxane"; ACS Appl. Mater. Interfaces; vol. 3; 2011; pp. 546-552.
Guo, Haiquan et al.; "Tailoring Properties of Cross-Linked Polyimide Aerogels for Better Moisture Resistance, Flexibility, and Strength"; ACS Applied Materials Interfaces; vol. 4 (2012); pp. 5422-5429.
He, Jionghao et al.; "Characterization of Polyimide Gels Cross-linked with Hexamethylene Diisocyanate"; Polymer; vol. 41; 2000; pp. 4793-4802.
Hedrick, J.L. et al.; "Nanoporous Polyimides"; Advances in Polymer Science; vol. 141; 1999; 43 pp.
Herrault, F. et al.; "Electrodeposited Metal Structures in High Aspect Ratio Cavities using Vapor Deposited Polymer Molds and Laser Micromachining"; Solid-State Sensors, Actuators and Microsystems Conference; 2007; Transducers 2007 International; 4pp.
Hoyas, A. Martin et al.; "Plasma sealing of a low-K dielectric polymer"; Microelectronic Engineering; vol. 76; 2004; pp. 32-37.
Hrubesh, L.W. et al.; "Thin aerogel films for optical, thermal, acoustic and electronic applications"; Journal of Non-Crystalline Solids; 188; 1995; pp. 46-53.
Hrubesh, L.W.; "Aerogel Applications"; Journal of Non-Crystalline Solids; 225; 1998; pp. 335-342.
Hrubesh, L.W. et al.; "Dielectric properties of aerogels"; J. Mater. Res.; vol. 8; No. 7; Jul. 1993; pp. 1736-1741.
Juneja, Jasbir S. et al.; "Dielectric barriers, pore sealing, and metallization"; Thin Solid Films; vol. 504; 2006; pp. 239-242.
Kaleta, T. et al.; "A Two Layer Hermetic-Like Coating Process for On-Wafer Encapsulation of GaAs MMIC's" GaAs IC Symposium IEEE Gallium Arsenide Integrated Circuit Symposium 17th Annual Technical Digest 1995, 1995, pp. 128-131, doi: 10.1109/GAAS. 1995.528977.
Kawagishi, Ken et al., "Superior Nanoporous Polyimides via Supercritical $CO_2$ Drying of Jungle-Gym-Type Polyimide Gels"; Macromolecular Rapid Communications; 28; 2007; pp. 96-100.
Khune, G.D. et al.; "Preparation and Properties of Polyimides and Diisocyanates"; Journal of Macromolecular Science; Part A; Chemistry; vol. 14; Issue No. 5; 1980; pp. 687-711.
Kilic, Soner et al.; "Polyimides via the Direct Reaction of Diisocyanates and Dianhydrides"; Polymer Preprints; vol. 27(1); 1986; pp. 318-319.
Krause, B. et al.; "Novel Thin Film Polymer Foaming Technique for Low and Ultra Low-K Dielectrics"; IEEE $7^{th}$ International Conference on Solid Dielectrics; Jun. 25-29, 2001; pp. 187-190.
Kuo, Ming-Shu et al.; "Surface and near-surface modifications of ultralow dielectric constant materials and exposed to plasmas under sidewall-like conditions"; J. Vac. Sci. Technol. B; 28 (6); Nov./Dec. 2010; pp. 1104-1110.
Labadie, J.W. et al.; "Polyimides with reduced dielectric anisotropy"; Electronic Components and Technology Conference; 1993 Proceedings.; $43^{rd}$; Jun. 1-4, 1993; pp. 327-329.

(56) References Cited

OTHER PUBLICATIONS

Labadie, Jeff W. et al.; "Nanopore foams of high temperature polymers"; IEEE Transactions on Components, Hybrids, and Manufacturing Technology; vol. 15; No. 6; Dec. 1992; pp. 925-930.
Leventis, Nicholas et al.; "Isocyanate-Derived Organic Aerogels: Polyureas, Polyimides, Polyamides"; Mater. Res. Soc. Symp. Proc.; vol. 1306; 2011; 14pp.
Leventis, Nicholas et al.; "Multifunctional Polyurea Aerogels from Isocyanates and Water. A Structure-Property Case Study"; Chemistry of Materials.; vol. 22; 2010; pp. 6692-6710.
Leventis, Nicholas et al.; "Multifunctional porous aramids (aerogels) by efficient reaction of carboxylic acids and isocyanates"; J. Mater. Chem.; vol. 21; 2011; pp. 11981-11986.
Liaw, Der-Jang et al.; "Advanced polyimide materials: Syntheses, physical properties and applications"; Progress in Polymer Science; vol. 37; 2012; pp. 907-974.
Maier, G.; "Low dielectric constant polymers for microelectronics"; Progress in Polymer Science; 26; 2001; pp. 3-65.
Mathews, Anu Stella et al., "Synthesis, Characterization, and Properties of Fully Aliphatic Polyimides and Their Derivatives for Microelectronics and Optoelectronics Applications"; Macromolecular Research; vol. 15; No. 2; 2007; pp. 114-128.
Meador, Mary Ann B. et al.; "Synthesis and Properties of Nanoporous Polyimide Aerogels Having a Covalently Bonded Network Structure"; Polymer Preprints; vol. 51(1); 2010; pp. 265-266.
Meador, Mary Ann B. et al.; "Mechanically Strong, Flexible Polyimide Aerogels Cross-Linked with Aromatic Triamine"; Applied Materials and Interfaces; vol. 4; 2012; pp. 536-544.
Meador, Mary Ann B. et al.; "Polyimide Aerogel Thin Films"; NASA Tech Briefs; Jul. 2012; p. 15.
Meador, Mary Ann B. et al.; "Low Dielectric Polyimide Aerogels as Substrates for Lightweight Patch Antennas"; Applied Materials and Interfaces; vol. 4(11); 2012; pp. 6346-6353.
Meador, Mary Ann B. et al.; "Dielectric and Other Properties of Polyimide Aerogels Containing Fluorinated Blocks"; Applied Materials and Interfaces; vol. 6; 2014; pp. 6062-6068.
Meyers, R.A. et al.; "A Novel Condensation Polymerization"; Polymer Preprints; vol. 10(1); 1969; pp. 186-192.
Meyers, R.A.; "The Polymerization of Pyromellitic Dianhydride with Diphenylmethane Diisocyanate"; Journal of Polymer Science: Part A-1; vol. 7; 1969; pp. 2757-2762.
Musaev, O.R. et al.; "UV laser ablation of parylene films from gold substrates"; J Mater Sci.; vol. 46; 2011; pp. 183-187.
Narechania, Rajesh G. et al.; "Polyimide Adhesion Characteristics"; *Reliability Physics Symposium*, 1984, 22nd Annual, pp. 214-217.
Nien, Kou-En et al.; "The Effects of Reaction Conditions on the Synthesis and Properties of Polypyromellitimide"; Journal of Polymer Engineering; vol. 17; No. 1; 1997; pp. 23-37.
Nieto, Jose L. et al.; "Aliphatic-Aromatic Polyamide-Imides from Diisocyanates, 1 $^1$H and $^{13}$C NMR Study of Polymer Structure"; Makromol. Chem.; vol. 183; 1982; pp. 557-578.
Pan, Jiang-Qing et al.; "Applications of Isocyanation for Polymer Systems"; J. Macromol. Sci.—Polymer Reviews; C41(1&2); 2001; pp. 95-117.
Pierre, Alain C. et al.; "Chemistry of Aerogels and Their Applications"; Chem. Rev.; vol. 102; 2002; pp. 4243-4265.
Puyrenier, W. et al.; "Characterization of the impact of plasma treatments and wet cleaning on a porous low k material"; ScienceDirect; Microelectronic Engineering; vol. 83; 2006; pp. 2314-2318.
Puyrenier, Wilfried et al.; "Effect of plasma treatments on a porous low-k material—Study of pore sealing"; Science Direct; Microporous and Mesoporous Materials; vol. 106; 2007; pp. 40-48.
Ren, Yuxing et al.; "Low Temperature Processable Ultra-Low Dielectric Porous Polyimide for High Frequency Applications"; Electronic Materials and Packaging, International conference on, IEEE, 2006, 5pp.
Rigacci, A. et al.; "Preparation of polyurethane-based aerogels and xerogels for thermal superinsulation"; Journal of Non-Crystalline Solids; vol. 350; 2004; pp. 372-378.
Sasaki, Kaname et al.; "Facile Amide Bond Formation from Carboxylic Acids and Isocyanates"; Organic Letters; vol. 13; No. 9; 2011; pp. 2256-2259.
Saunders, R.S. et al.; "Microporous Polyimide Films for Reduced Dielectric Applications"; Sandia Report SAND94-2831; Aug. 1996; 16 pp.
Simpson, J.O. et al.; "Fundamental insight on developing low dielectric constant polyimides"; Thin Solid Films; vol. 308-309; 1997; pp. 480-485.
Sroog, C. E.; "Polyimides"; Prog. Polym. Sci.; vol. 16; 1991; pp. 561-694.
Travaly, Y. et al., "A theoretical and experimental study of atomic-layer-deposited films onto porous dielectric substrates"; Journal of Applied Physics; vol. 98; 2005; 10pp.
Ulrich, Henri; "Synthesis of Polymers from Isocyanates in Polar Solvents"; Journal of Polymer Science: Macromolecular Reviews; vol. 11; 1976; pp. 93-133.
Vanhaelemeersch, S. et al.; "Dry Etching of Low K Materials"; Interconnect Technology; 1999; IEEE International Conference; pp. 97-99.
Verdonck, P. et al.; "Influence of the ion bombardment of $O_2$ plasmas on low-k materials"; Thin Solid Films; vol. 520; 2011; pp. 464-468.
Verdonck, P. et al.; "The influence of N containing plasmas on low-kfilms"; Microelectronic Engineering; vol. 88; 2011; pp. 627-630.
Verdonck, P. et al.; "Fundamental Study of Atomic Layer Deposition in and on Porous Low-k Films"; Interconnect Technology Conference and 2011 Materials for Advanced Metallization (IITC/MAM); 2011 IEEE International; 3pp.
Verdonck, P., et al.; "Chemisorption of ALD precursors in and on porous low-k films"; Microelectronic Engineering; 106; 2013; pp. 81-84.
Vinogradova, S.V. et al.; "Chemical Cyclization of Poly(Amidoacids) in Solution"; Polymer Science U.S.S.R, vol. 16, Issue 3; 1974; pp. 584-589.
Volksen, W.; "Condensation Polyimides: Synthesis, Solution Behavior, and Imidization Characteristics"; Advances in Polymer Science; vol. 117; 1994; pp. 113-164.
Wang, Huei-Hsiung et al.; "Synthesis of Thermostable Polyamideimides and Their Properties"; Journal of Applied Polymer Science; vol. 60; 1996; pp. 1579-1585.
Wang, Huei-Hsiung et al.; "Synthesis and Properties of Thermostable Napthalate-Containing Copoly (amide-imide)s"; Journal of Applied Polymer Science; vol. 65; Issue 8; 1997; pp. 1581-1593.
Whittington, James K. et al.; "Internal Conformal Coatings for Microcircuits"; IEEE Transactions on Components, Hybrids, and Manufacturing Technology; vol. CHMT-1; No. 4; Dec. 1978; pp. 416-422.
Witucki, Gerald L.; "A Silane Primer: Chemistry and Applications of Alkoxy Silanes"; Journal of Coatings Technology; vol. 65; No. 822; Oct. 21, 1992; 4pp.
Yamazaki, Osamu et al.; "Preparation and Properties of Poly(amid acid) Gels"; Reactive & Functional Polymers; vol. 43; 2000; pp. 173-181.
Zhai, Yan et al.; "The study on imidization degree of polyamic acid in solution and ordering degree of its polymide film"; J. Mater. Sci.; vol. 43; 2008; pp. 338-344.
Zhai, Yan et al.; "Phase Separation of Poly(amic acid-co-imide) Solution"; Chem. Eng. Comm.; 197; 2010; pp. 289-304.
Imai, Yoshio; "Rapid Synthesis of Polyimides from Nylon-Salt-Type Monomers"; Advances in Polymer Science, vol. 140; 1990; 199pp.

\* cited by examiner

FIG. 8
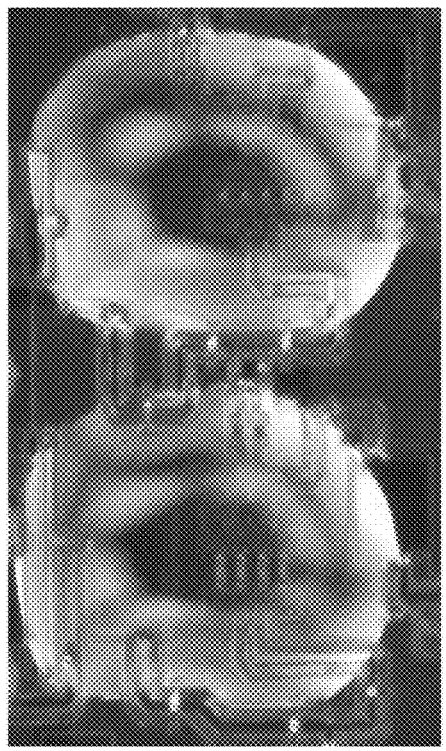
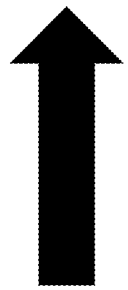
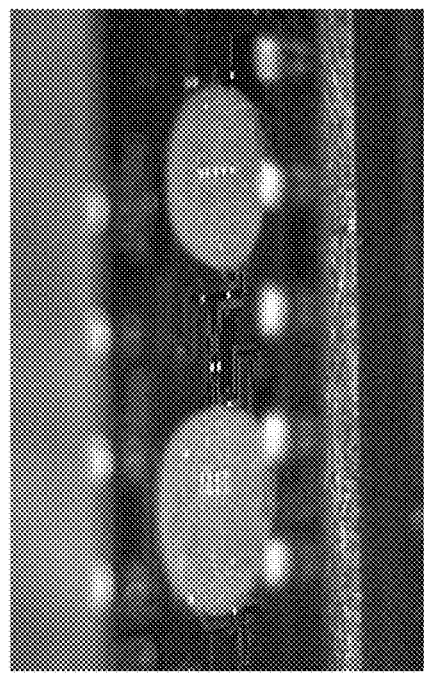

FIG. 9 Reaction Scheme 1

DISPENSABLE POLYIMIDE AEROGEL PREPOLYMER, METHOD OF MAKING THE SAME, METHOD OF USING THE SAME, AND SUBSTRATE COMPRISING PATTERNED POLYIMIDE AEROGEL

BACKGROUND

Dielectric coatings are utilized with integrated circuits for encapsulation and to provide performance reliability similar to that provided by hermetic packaging. The dielectric coatings can be applied to integrated circuits in a face up or "flip chip" configuration. Face up circuits are coated and/or encapsulated to provide mechanical integrity. Flip chip circuits are underfilled to alleviate solder joint fatigue due to coefficient of thermal expansion (CTE) mismatches between the chip and board and to provide structural support for the solder joints, in addition to the aforementioned environmental protection.

The performance of integrated circuits (ICs) that operate at microwave frequencies (e.g., 0.3 to 300 GHz) such as, for example, monolithic microwave integrated circuits (MMICs), is degraded by parasitic "dielectric loading" effects of coatings and environmental contaminants having dielectric properties significantly different from those of air (air having a dielectric constant of ~1 and loss tangent of about zero). For example, the critical internode capacitance parameters for MMICs are easily detuned by the parasitic effects of higher dielectric constant materials that infiltrate the sensitive field effect transistor (FET) region. This is referred to as the "dielectric loading" effect and can occur due to conformal coating, encapsulation, underfill, and/or random events, such as moisture condensation. Other than thin passivation layers that are routinely applied to the circuits during wafer fabrication (e.g., silicon-oxide, silicon-nitride, etc.), MMIC devices are designed to function optimally with air as the primary dielectric covering the circuit. Previous coatings for integrated circuits have had a dielectric constant 2 to 4 times higher than that of air. Radio frequency (RF) losses from such coatings can be very significant at the X-band or above (e.g., 8 to 12 GHz, or above) and tend to increase with power levels. For example, a 1 dB or more drop in gain may be observed for a single stage device, while a 3 to 5 dB or more drop in gain may be observed for a multi-stage power amplifier (PA) MMIC.

Including a dielectric coating in an IC having an RF design is difficult. For example, the effective dielectric constant of the dielectric coating may vary with temperature, frequency, degree of cure, moisture saturation, etc. Also, the coating thickness may vary from lot to lot (e.g., may vary from batch to batch) during manufacture. Additionally, accurate electromagnetic (EM) models for coatings on FETs are lacking. Further, extrapolating wafer-level RF test data to coated assemblies adds a level of uncertainty in predicting assembly level performance and test yields.

Furthermore, increasing MMIC input drive levels to account for the losses arising from the deficiencies of a dielectric coating results in undesirable effects. For example, increasing the MMIC input drive levels adds the risk of RF stability and/or reliability issues. Additionally, increasing the MMIC input drive levels increases power dissipation, cooling requirements, weight, and cost.

SUMMARY

Embodiments of the present disclosure generally relate to polyimide aerogel prepolymers, methods of making and using the same, and substrates including patterned polyimide aerogels.

In some embodiments, a method for manufacturing a patterned polyimide aerogel film on a substrate includes: dispensing a polyimide prepolymer sol onto a first portion of a surface of a substrate, a second portion of the surface of the substrate being substantially free of the polyimide prepolymer sol, and the polyimide prepolymer sol having a viscosity of 1,000 to 20,000 centipoise over a time period of 4 hours or more; forming a patterned film of a polyimide prepolymer gel on the substrate from the polyimide prepolymer sol; drying the polyimide prepolymer gel to form a patterned film of a polyimide prepolymer aerogel on the substrate; and curing the polyimide prepolymer aerogel on the substrate to form the patterned polyimide aerogel film on the first portion of the surface of the substrate, the second portion of the surface of the substrate being substantially free of the patterned polyimide aerogel film.

The polyimide prepolymer gel may be substantially free of dehydrating agents. In some embodiments, the polymer gel is substantially free of dehydrating agents and imidization catalysts.

The dispensing of the polyimide prepolymer sol may include dot dispensing, jetting, and/or free-form direct writing.

The polyimide prepolymer sol may include polyimide aerogel precursors, water, a non-dehydrating catalyst, and a first solvent.

The polyimide prepolymer sol may include a first solvent, and the forming of the patterned film of the polyimide prepolymer gel may further include dispensing a second solvent over the patterned film of the polyimide prepolymer gel in an amount suitable to control a rate of evaporation of the first solvent from the polyimide prepolymer gel and to maintain the porous structure of the polyimide prepolymer gel pattern.

The first solvent may include a polar aprotic solvent.

The polyimide prepolymer sol may be formed from a mixture including a diisocyanate, a dianhydride, and a tetracarboxylic acid.

The diisocyanate and dianhydride may react to directly form an imide group without release of water.

The dianhydride may be represented by Formula 1:

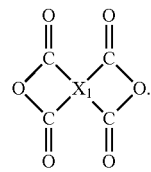

Formula 1

The tetracarboxylic acid may be represented by Formula 2:

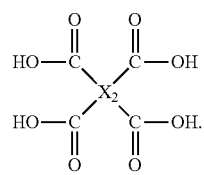

Formula 2

In Formulae 1 and 2, $X_1$ and $X_2$ may each independently be a tetravalent radical including at least two carbon atoms.

In Formulae 1 and 2, $X_1$ and $X_2$ may each independently be selected from a substituted or non-substituted aromatic group, a substituted or non-substituted aliphatic group, a substituted or non-substituted cycloaliphatic group, a substituted or non-substituted heterocycloaliphatic group, and a substituted or non-substituted heteroaromatic group.

The method may further include treating the surface of the substrate with an organosilane coupling agent, an adhesion promoter, or both before the dispensing of the polyimide prepolymer sol.

In some embodiments, a dispensable composition for forming a patterned polyimide aerogel film includes: a polyimide aerogel precursor, a non-dehydrating catalyst, and a first solvent, the composition having a viscosity of 1,000 to 20,000 centipoise over a time period of 4 hours or more.

The composition may be substantially free of dehydrating agents. In some embodiments, the composition is substantially free of dehydrating agents and imidization catalysts.

The composition may have a viscosity of about 1,000 centipoise to about 20,000 centipoise at room temperature.

The polyimide aerogel precursor may be prepared from a mixture of a dianhydride and a tetracarboxylic acid in the first solvent.

The non-dehydrating catalyst may include a nucleophilic catalyst.

The dianhydride may include one or more compounds selected from: pyromellitic dianhydride, 3,3'4,4'-benzophenone tetracarboxylic dianhydride, benzene-1,2,3,4-tetracarboxylic dianhydride, 2,2',3,3'-benzophenone tetracarboxylic dianhydride, 2,3,3',4'-benzophenone tetracarboxylic dianhydride, naphthalene-2,3,6,7-tetracarboxylic dianhydride, naphthalene-1,2,5,6-tetracarboxylic dianhydride, naphthalene-1,2,4,5-tetracarboxylic dianhydride, naphthalene-1,2,5,8-tetracarboxylic dianhydride, naphthalene-1,2,6,7-tetracarboxylic dianhydride, 4,8-dimethyl-1,2,3,5,6,7-hexahydronaphthalene-1,2,5,6-tetracarboxylic dianhydride, 4,8-dimethyl-1,2,3,5,6,7-hexahydronaphthalene-2,3,6,7-tetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, 1,4,5,8-tetrachloronaphthalene-2,3,6,7-tetracarboxylic dianhydride, 3,3',4,4'-diphenyl-tetracarboxylic dianhydride, 2,2',3,3'-diphenyl-tetracarboxylic dianhydride, 2,3,3',4'-diphenyl-tetracarboxylic dianhydride, 2,3",4,4"-p-terphenyl-tetracarboxylic dianhydride, 2,2",3,3"-p-terphenyl-tetracarboxylic dianhydride, 2,3,3",4"-p-terphenyl-tetracarboxylic dianhydride, 2,2-bis(2,3-dicarboxyphenyl) propane dianhydride, 2,2-bis(3,4-dicarboxyphenyl)propane dianhydride, bis(2,3-dicarboxyphenyl) ether dianhydride, bis(3,4-dicarboxyphenyl) ether dianhydride, bis(2,3-dicarboxyphenyl)methane dianhydride, bis(3,4-dicarboxyphenyl)methane dianhydride, bis(2,3-dicarboxyphenyl) sulfone dianhydride, bis(3,4-dicarboxyphenyl) sulfone dianhydride, 1,1-bis(2,3-dicarboxyphenyl)ethane dianhydride, 1,1-bis(3,4-dicarboxyphenyl)ethane dianhydride, perylene-2,3,8,9-tetracarboxylic dianhydride, perylene-3,4,9,10-tetracarboxylic dianhydride, perylene-4,5,10,11-tetracarboxylic dianhydride, perylene-5,6,11,12-tetracarboxylic dianhydride, phenanthrene-1,2,7,18-tetracarboxylic dianhydride, phenanthrene-1,2,6,7-tetracarboxylic dianhydride, phenanthrene-1,2,9,10-tetracarboxylic dianhydride, and hydrogenated products thereof; cyclopentane-1,2,3,4-tetracarboxylic dianhydride, cyclobutane-tetracarboxylic dianhydride, bicyclo[2,2,2]octa-7-en-2-exo,3-exo,5-exo,6-exo-tetracarboxylic acid 2,3:5,6-dianhydride, and bicyclo[2,2,1] heptane-2-exo,3-exo,5-exo,6-exotetracarboxylic acid 2,3:5, 6-dianhydride; and pyrazine-2,3,5,6-tetracarboxylic dianhydride, pyrrolidine-2,3,4,5-tetracarboxylic dianhydride and thiophene-2,3,4,5-tetracarboxylic dianhydride.

In some embodiments, a substrate includes: a patterned polyimide aerogel including at least one region having a contact angle between a surface of the substrate and a surface of the polyimide aerogel of greater than 0 to less than or equal to 90 degrees.

The contact angle between the surface of the substrate and the surface of the polyimide aerogel may be 5 to 25 degrees. For example, the contact angle between the surface of the substrate and the surface of the polyimide aerogel may be 5 to 20 degrees.

The substrate may include a field effect transistor (FET) and/or a FET-containing region on the substrate and the patterned polyimide aerogel may be on the FET and/or the FET-containing region.

BRIEF DESCRIPTION OF THE DRAWINGS

The accompanying drawings, together with the specification, illustrate embodiments of the present disclosure, and, together with the description, serve to explain the principles of the present disclosure.

FIG. 8 includes a pair of images illustrating embodiments of patterned polyimide aerogel films.

DETAILED DESCRIPTION

Embodiments of the present disclosure relate to processes and materials for additive patterning, in contrast to subtractive etching or lithographic patterning, of a polyimide aerogel film (e.g., direct write patterning or printing of a low dielectric constant encapsulation layer) on a sensitive component or region of a substrate (e.g., on one or more regions of a sensitive circuit) to insulate the sensitive component or region from the parasitic effects of higher dielectric constant coatings (e.g., underfill). The substrate may include any of a variety of suitable circuit boards available in the art, including without limitation, integrated circuits, semiconductor wafers, bumped flip chip wafers, thin film networks, printed circuit boards, printed wiring boards, hybrid boards, and the like. Further, the substrate may include circuit assemblies, including without limitation, hybrid microelectronic circuit assemblies, multi-chip modules, chip-on-board assemblies, chip-and-wire assemblies, flip chip assemblies, ceramic chip carrier assemblies, plastic molded package assemblies, and the like.

Figure 1:
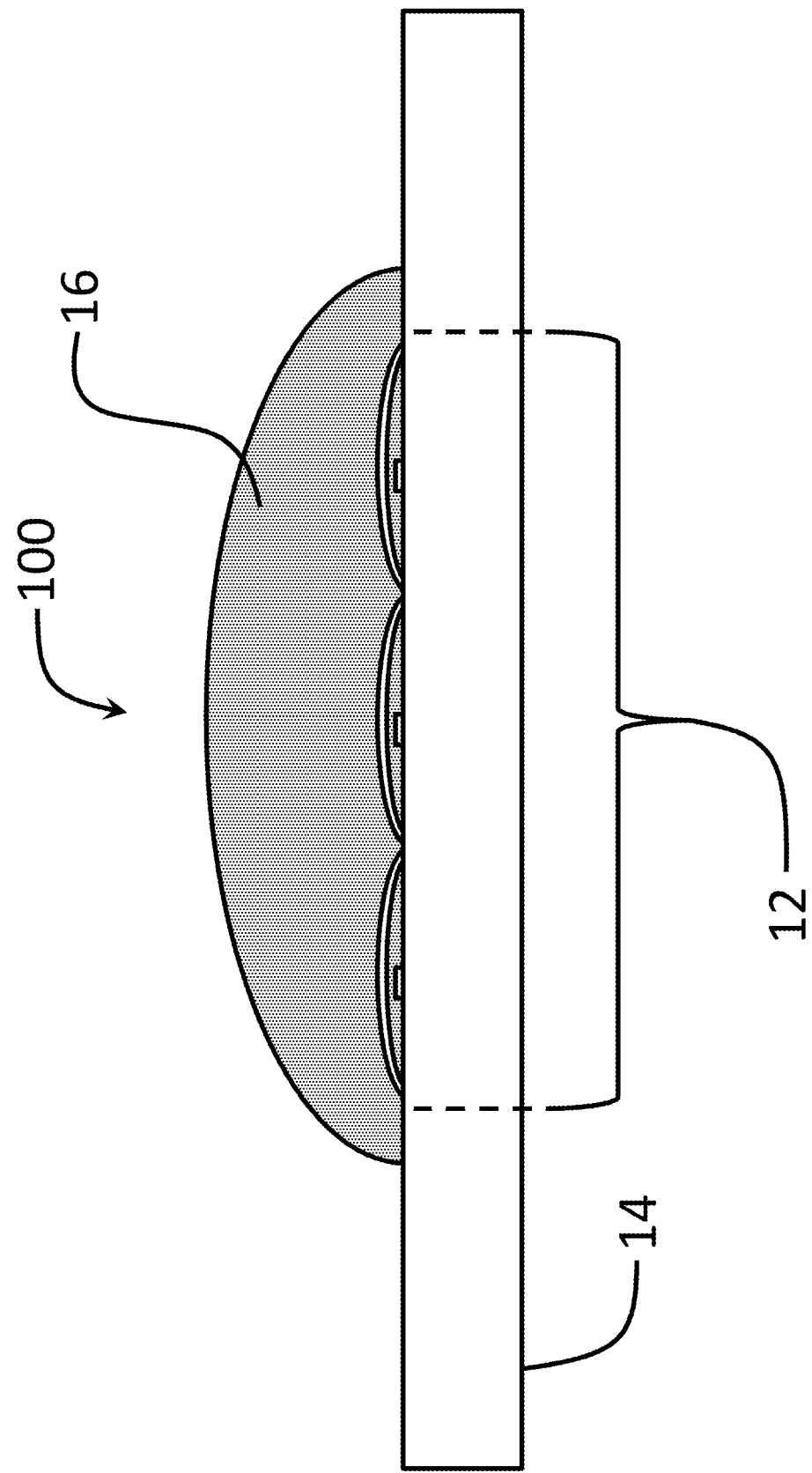
FIG. 1 is a cross-sectional view of a portion of an embodiment of an electronic device.

For example, FIG. 1 is a cross-sectional view showing a portion of an electronic device 100 (e.g., a face-up moduleless chip) including a sensitive component or region 12 on a substrate 14, which may include, for example, silicon (Si), gallium arsenide (GaAs), gallium nitride (GaN), silicon germanium (SiGe), silicon carbide (SiC), indium phosphide (InP), alumina, or aluminum nitride (AlN). Non-limiting examples of the sensitive component or region include a field-effect transistor ("FET"), a FET containing region, a through-hole, a wave guide, a via, an air bridge, a bond wire, a solder joint, a transmission line, an inductor, a conductor, a capacitor, a filter, a delay line, a coupler, a resonator, an impedance matching network, an attenuator, a resistor, a switch, and/or a circulator. A polyimide aerogel film 16 is additively patterned to cover at least a portion of the electronic device 100, including the sensitive component or region 12 and, optionally, any other sensitive components or regions of the electronic device 100. The remaining portion of the electronic device 100 may be substantially free of the aerogel film and may include areas that remain open for electrical interconnections to be formed, for example, wire bond pads, probe pads, ground pads, signal pads, solder bumps, and the like. The electronic device 100 may further include one or more of any suitable layers available in the art on the polyimide aerogel film 16, or the polyimide aerogel film 16 may be exposed to the environment (e.g., air). In the present drawings, including FIG. 1, a single contact angle between the polyimide aerogel film 16 and the substrate 14 may be shown for ease of depiction. The contact angle, however, is not limited to that shown in the drawings. On the contrary, the contact angle between the polyimide aerogel film 16 and the substrate 14 may be any suitable contact angle. For example, the contact angle may be greater than 0 to less than or equal to 90 degrees, or 5 to 25 degrees. In some embodiments, the contact angle of the finished product may be 90 degrees (e.g., about 90 degrees) when a laser ablation technique is used to further define or cut the additively patterned aerogel film 16 during post-patterning processing to form sharply defined geometric features (e.g., vias, circles, edges, ovals, and/or the like) for high density or fine-pitch applications.

Figure 2:
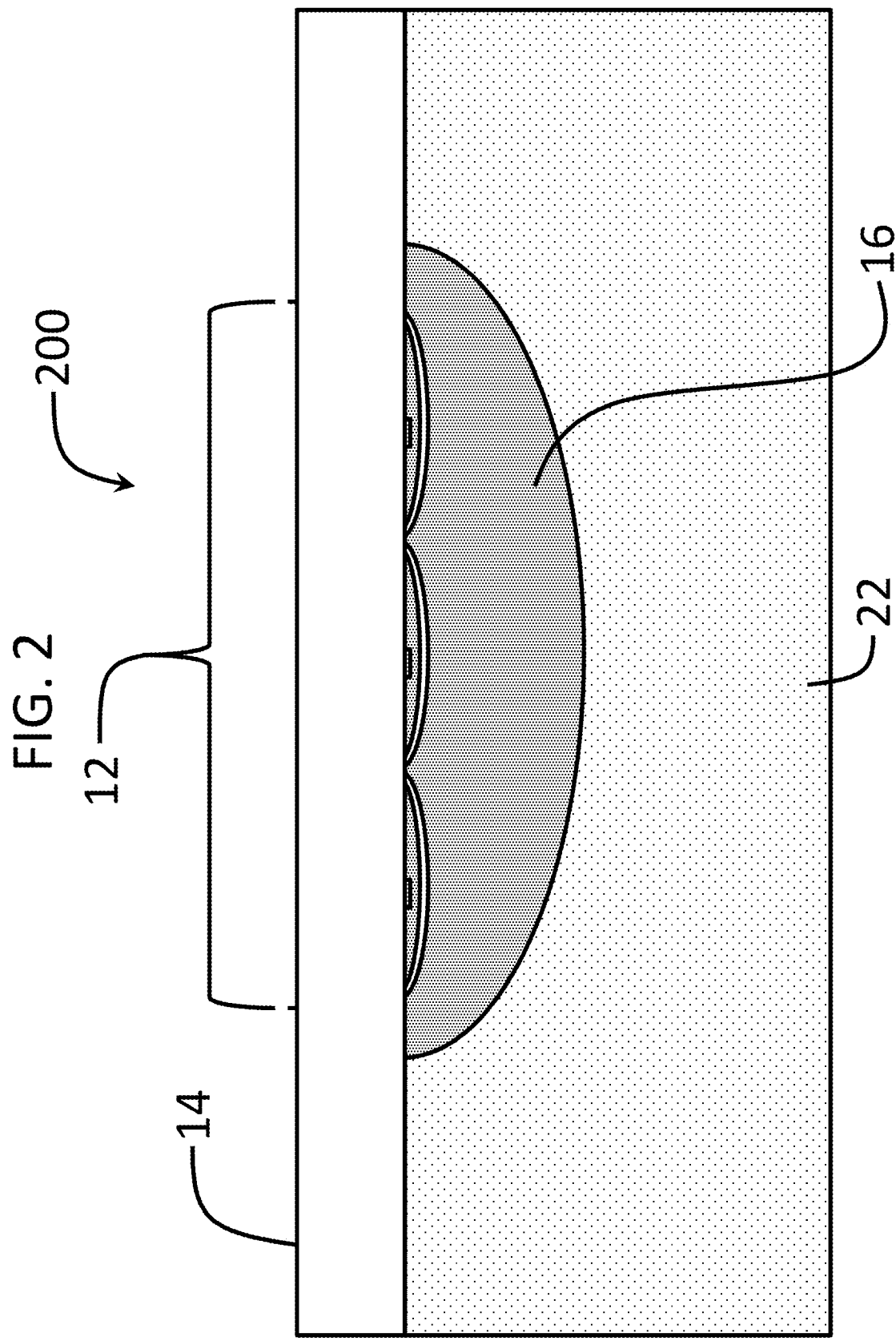
FIG. 2 is a cross-sectional view of a portion of another embodiment of an electronic device.

The electronic device of the present disclosure, however, is not limited to a "face-up" configuration. For example, FIG. 2 is a cross-sectional view of a portion of an electronic device 200 (e.g., a "flip chip" device) including the sensitive component or region 12 on the substrate 14, and the polyimide aerogel film 16 on the sensitive component or region 12. The electronic device 200 further includes an underfill 22 on the polyimide aerogel film 16 and on the substrate 14. The underfill 22 may include any suitable underfill available in the art (e.g., Hysol FP-4531, Hysol FP-4546, and/or Hysol FP-4511, each of which is available from Henkel; Namics 8437-2 and/or 8410-99, each of which is available from Namics Corporation; and/or Zymet CN-1533, available from Zymet). The electronic device 200 may, optionally, further include any suitable layer available in the art between the polyimide aerogel film 16 and the underfill 22 and/or between the substrate 14 and the underfill 22. The remaining portion of the electronic device 200 is free (or substantially free) of the aerogel film and may include areas that remain uncoated for electrical interconnections to be formed, for example, for flip chip solder joints, wire bonds, pinned connections, and the like to be formed, and/or to provide direct attachment between the underfill and chip surface for mechanical integrity.

Figure 3:
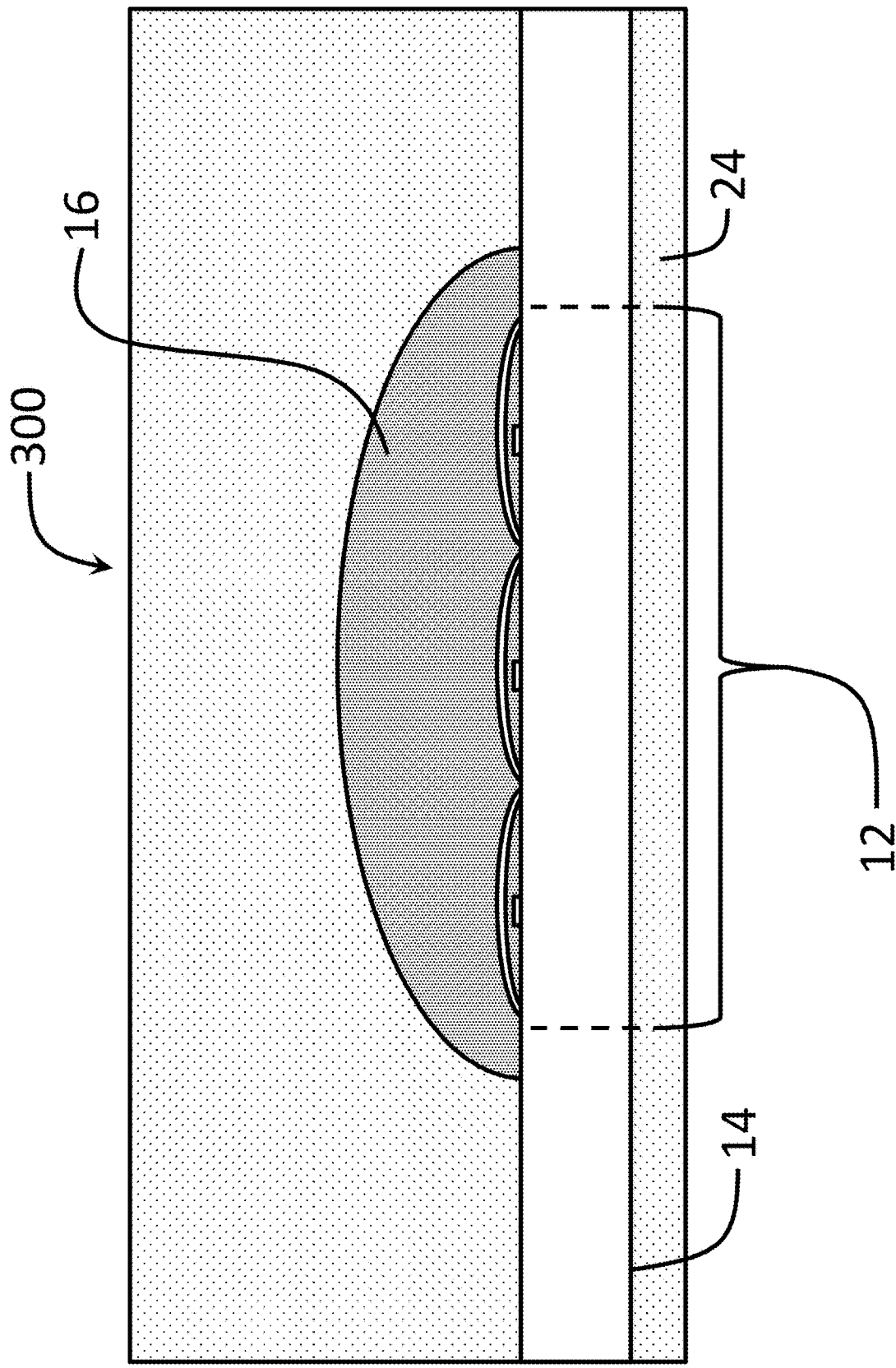
FIG. 3 is a cross-sectional view of a portion of another embodiment of an electronic device.

FIG. 3 is a cross-sectional view of a portion of an electronic device 300 at least partially encapsulated in a polymer 24 (e.g., a plastic molding compound, a potting compound, a glob top encapsulant, a conformal coating, a dam and fill material, or a combination or mixture thereof). The polymer 24 may include, for example, a liquid crystal polymer, an acrylic, an epoxy or silicone-modified epoxy, a silicone, a polyurethane, a benzocyclobutene (BCB), a polyimide or silicone-modified polyimide, a parylene, a perfluoroether, a polyamide, a polyamide-imide, a fluoropolymer, a phenolic resin, a polyarylate, a polysulfide, a polyetherketone, a polyethersulphone, a polyetherimide, a polyphenylene ether, a polycyclicolefin, a butadiene-styrene, or a combination or mixture thereof. The electronic device 300 further includes the sensitive component or region 12, the substrate 14, and the polyimide aerogel film 16. The electronic device 300 may, optionally, further include any suitable layer available in the art between the polyimide aerogel film 16 and the polymer 24. The low cost plastic encapsulated package of FIG. 3 may be utilized when sensitive FETs are protected from a molding compound and/or glob top encapsulant. Further, the polyimide aerogel film 16 may cover and protect other sensitive elements in the assembly and/or package, such as bond wires, solder joints, and the like.

Embodiments of the polyimide aerogel film may be utilized to provide environmental protection (e.g., as a low dielectric encapsulant) for integrated circuits (ICs) such as, for example, monolithic microwave integrated circuits (MMICs). For example, the polyimide aerogel may be utilized in module-less radar applications to reduce production costs and improve the size, weight, and power (SWaP) of radar systems. In some embodiments, the polyimide aerogel film has a thickness greater than 5 μm (e.g., 50 to 5,000 μm), a dielectric constant (k) of less than or equal to 2.0 at X-band frequencies or higher (e.g., less than or equal to 1.5, or 1.0 to 1.5 at 8 to 12 GHz, or higher), a loss tangent (δ) less than or equal 0.010 (e.g., less than or equal to 0.005 or less than 0.003), and/or the polyimide aerogel film provides low loss encapsulation (e.g., the aerogel encapsulation is of suitable or sufficient thickness and dielectric properties, e.g., properties close to those of air, to encapsulate MMIC air bridges and buffer intense EM fields around a FET region from dense, higher dielectric coatings and contaminants). In some embodiments, a thickness of the polyimide aerogel film is thicker than that of the substrate, for example, when electromagnetic (EM) fields are substantial or significant above a circuit, such as in designs that utilize RF microstrip transmission lines.

Embodiments of the present disclosure provide a dispensable polyimide prepolymer sol with good work life that is suitable for additive patterning of low dielectric polyimide aerogel films on substrates. In contrast, polyimide aerogels as low dielectric layers have previously been formed by casting on a substrate (e.g., by spin coating, doctor blading, spray coating, dip coating, and/or the like) a planar, uniform film of a poly(amic acid) prepolymer sol that includes a dehydrating agent/imidization catalyst and/or crosslinking agent added to the sol prior to coating to induce the coated sol to form a wet gel film. As used herein, the term "uniform" and similar terms may refer to a feature that is uniform or substantially uniform. The poly(amic acid) (PAA) sol of previous polyimide aerogels is formed from the polycondensation reaction of a dianhydride with a diamine in a polar, aprotic solvent in a prior stage. The solvent is then carefully removed from the wet gel film while avoiding the capillary surface tension effects of evaporation, for example, by supercritical or subcritical drying, to yield the porous networked polymer structure of the dried aerogel. Depending upon the scheme utilized to form the wet gel, the wet gel film and corresponding dried aerogel may either have a polyimide structure or a crosslinked PAA structure at this stage. After complete or substantially complete imidization, the polyimide aerogel film is then post-patterned, for example, by lithography.

When a dehydrating agent/imidization catalyst mixture is added to the PAA sol prior to casting, the result is a polyimide gel structure. In this case, gelation apparently takes place via concurrent (e.g., simultaneous) phase separation and chemical imidization (e.g., conversion of the PAA to the insoluble polyimide gel by chemical means) at room temperature. The imidization catalyst may include, for example, a base, such as pyridine, isoquinoline, and/or triethylamine. The dehydrating agent scavenges the water released by condensation during formation of the imide bond and may include, for example, acetyl chloride, acetic anhydride, and other anhydrides of monocarboxylic acids known to be suitable for cyclodehydration of poly (amic acids) to polyimides. Both the dehydrating agent and imidization catalyst (e.g., acetic anhydride and pyridine) are present in the PAA sol mixture and are added in sufficient quantity to effectively complete imidization to form the polyimide wet gel at room temperature. A stoichiometric amount of the dehydrating agent may be considered equivalent to a 2:1 molar ratio of the agent to the PAA base mole (e.g., assuming two units of acetic anhydride required to remove water released by cyclization of the two amic acid linkages per PAA unit), but a large molar excess (e.g., a molar ratio of 4:1, 8:1, or 10:1 of the acetic anhydride to the PAA base mole) is utilized with an equivalent molar amount of the imidizaton catalyst (e.g., a molar ratio of 1:1 for the acetic anhydride to the pyridine) to form polyimide gels of good strength. While the imidization catalyst alone may be sufficient to convert some of the PAA sol to polyimide, this approach leads to poor results with wet gel films as elevated temperature (e.g., 100° C. or higher) is required to remove the water by-product of the reaction and form a polyimide gel in a suitable amount of time. At elevated temperature, the viscosity of the PAA sol decreases significantly and the sol may runout, re-dissolve, or, more importantly, the solvent may evaporate from the porous structure of the gel, causing it to collapse to a dense polyimide film. Consequently, the polyimide aerogel gel films have previously been formed at room temperature using a mixture of the dehydrating agent and imidization catalyst in a large molar excess.

When a crosslinking agent is added to the PAA sol prior to casting, the result is a PAA gel structure. In this case, gelation apparently takes place via concurrent (e.g., simultaneous) phase separation and crosslinking of the PAA polymer chains without imidization. The crosslinked PAA wet gel can then be chemically imidized in situ by adding the dehydrating agent/imidization catalyst before deposition, as described above, or imidized thermally at a later stage, either before or after drying, to yield the polyimide aerogel. When the crosslinking agent is added to the PAA sol in conjunction with a dehydrating agent/imidization catalyst, the result is a crosslinked polyimide gel structure with physical properties that may be superior to aerogels formed using dehydrating agent/imidization catalyst alone. However, the addition of a crosslinking agent is known to cause rapid gelation of the PAA sols, so the chemical imidization agents are added substantially immediately before gelation occurs. The crosslinking agent may include a polyfunctional monomer having a functionality greater than two, such as a triamine (e.g., 1,3,5-triaminophenoxybenzene), which is added to an anhydride end-capped PAA precursor mixture to form a branched, covalently bonded network that gels with or without imidization. The crosslinked PAA gel may also be formed by incorporating a functional group (e.g., a hydroxyl group, a carboxylic group, an amino group, an epoxy group) as a substituted group on the dianhydride and/or the diamine monomer backbone and then adding a polyfunctional crosslinking agent (e.g., a diamine, a diisocyanate, a dianhydride, a bifunctional silane, and/or the like) that is reactive to the substituted group, along with a catalyst, to form crosslinks (e.g., urea bonds, amide bonds, urethane bonds, siloxane bonds, epoxide bonds, and/or the like) across the PAA chains.

The dehydrating agent/imidization catalyst and/or crosslinking agent causes the PAA sol to gel within a short period of time (e.g., within 1 minute, within 5 minutes, within 30 minutes, within 45 minutes, within 60 minutes, or within a few hours after addition of the catalyst or crosslinking agent, depending upon the amount added). When the dehydrating agent/imidization catalyst and/or crosslinking agent is added to the sol prior to deposition, the sol is deposited well before the gel point is reached. Otherwise, the batch of sol may gel before it can be deposited or may gel inside the coating equipment (e.g., the dispense equipment). This can lead to costly repairs and/or replacement of expensive system components due to the great difficulty and labor involved in removing the insoluble polyimide gel. Since the gelation process starts with the addition of the catalyst and/or crosslinking agent to the sol prior to deposition, the work life of the sol should be no longer than the gel time and is often significantly less than the gel time. The "work life" refers to the period of time after the sol is mixed and loaded to the dispensing apparatus (e.g., a syringe, a cartridge, and/or the like) for which the sol remains dispensable (e.g., has suitable or sufficient viscosity to flow smoothly through the dispense equipment and form gels on the substrate surface without a significant increase in viscosity (e.g., a greater than 50% increase in viscosity) that would cause undesirable effects, such as stringing, skipping, tailing, film thickness variation, equipment clogging, and/or premature gelling on the substrate and/or in the dispense equipment). In practice, suitable or adequate consideration should also be given to the time required to transport the pre-mixed PAA sol from the mixing lab to the manufacturing facility, for the deposition process setup and dispense time, and for cleanup when determining the work life. These factors may further reduce the useable work life. Therefore, methods based on inducing gelation by adding a dehydrating agent/imidization catalyst and/or crosslinking agent suffer from rapid gel times and even shorter work life.

While the gel point of the PAA sol may be extended to a few hours (e.g., to 4 hours) by reducing the PAA concentration and/or adding less dehydrating agent, imidization catalyst, and/or crosslinking agent to the PAA sol, this leads to sols that gel weakly, form too slowly to avoid significant or unsuitable shrinkage due to the effects of evaporation and subsequently collapse, or may not form self-supporting films at all. Initially, the PAA sol may have a low starting viscosity (e.g., <1,000 centipoise (cps)) to allow adequate mixing and diffusion of the dehydrating agent, imidization catalyst, and/or crosslinking agent into the sol so that rapid, localized gelling and precipitation do not occur due to concentration gradient effects at the point/places where these agents are added to the sol. However, more viscous PAA sols, including partially imidized sols, gel too rapidly and/or unevenly upon addition of the dehydrating agent/imidization catalyst and/or crosslinking agent to be suitable for use in forming a polyimide aerogel film on a sensitive component or region of a substrate. Therefore, the low viscosity sols are first allowed to build up to a suitable or desired level of viscosity through imidization and/or crosslinking for some period of time before deposition. If the viscosity of the low viscosity sol is not allowed to increase to a suitable level prior to deposition, the viscosity is too low or variable to allow adequate control of the film thickness during the deposition process. As the gel point approaches, however, the viscosity is observed to increase exponentially (e.g., it approaches infinity) due to ongoing formation of insoluble imide and/or crosslinking and the sol becomes unstable (e.g., gelation is imminent and may occur spontaneously during deposition). Thus, the work life for forming gel films with these sols is significantly shorter than even the bulk gel time suggests.

Another challenge with the chemical imidization route for forming the polyimide wet gel is that the large molar excess of dehydrating agent/imidization catalyst utilized for inducing sufficient gel strength increases the volume of the PAA sol significantly (e.g., an increase of 10% to 40% by volume). Thus, the dehydrating agent/imidization catalyst has a significant diluting effect, thereby lowering the initial viscosity of the sol until sufficient time is allowed to pass for some imidization to occur and rebuild (increase) the viscosity. In addition, the added dehydrating agent and/or catalyst increases the vapor pressure and evaporation rate from the mixture, leading to solvent loss and unpredictable gelation of deposited sols. Solvent loss and unpredictable gelation occurs when the vapor pressure of the catalyst is significantly higher than that of the solvent, as when a pyridine catalyst (having a vapor pressure of about 20 mmHg at 25° C.) is added to a high boiling point solvent, such as N-methylpyrrolidone (NMP), which has a vapor pressure of about 0.3 mmHg at 25° C. Thus, PAA sols including a large molar excess of dehydrating agent/imidization catalyst may exhibit low viscosity, excessive bleed and/or runout on the substrate, a high evaporation rate, and a tendency to collapse to form a dense polyimide film.

Therefore, the PAA sols including dehydrating agent/imidization catalyst and/or crosslinking agent are either coated at a low viscosity, well before the gel point, which makes it difficult to achieve the desired thickness uniformity since the films may not be not self-supporting, or are coated very quickly at a higher viscosity, in a brief time window, before rapid thickening and partial gelation of the sol inhibit uniform flow, wetting, and coverage of the substrate. As a result, such PAA sols exhibit unstable viscosity, variable gelling of the sol, and short work life. For these reasons, such PAA sols are rapidly cast onto the substrate in a single pass to form a uniform film coating the substrate before the entire batch gels and, thus, are not satisfactory or suitable for being continuously dispensed (e.g., by direct writing) in an additive patterning process, whereby the gel can be dried and cured to form an aerogel in a set pattern without or substantially without additional etching and/or post-patterning (e.g., lithography). As used herein, the statement "substantially without additional etching and/or post-patterning (e.g., lithography)" may include instances in which a patterned film of a polyimide prepolymer gel is formed from a polyimide prepolymer sol, the polyimide prepolymer gel is dried to form a patterned film of a polyimide prepolymer aerogel, the polyimide prepolymer aerogel is cured to form a patterned polyimide prepolymer or polyimide aerogel film, and the patterned polyimide prepolymer or polyimide aerogel film is trimmed with a laser (e.g., in high density applications). As used herein, the terms "continuous," "continuously," and the like may refer to features that are continuous or substantially continuous, or features that are carried out continuously or substantially continuously. Instead, such sols are spin coated, doctor bladed, spray and/or dip coated, and then dried to form a uniform aerogel film completely or substantially completely covering a surface of a substrate. The dried aerogel film is then etched to the pattern shape by way of lithography.

Coating a uniform film followed by post-patterning, such as via lithography, however, is very complicated for aerogel films. Liquid or gaseous contaminants from wet or dry patterning processes rapidly infiltrate the exposed, porous structure of the aerogel, which degrades the dielectric and mechanical properties. For example, solvents from spin-on photoresists, resist developers, resist strippers, wet etchants, cleaning baths, and the like are readily wicked into the open-celled porous structure of the aerogel film, which swells and subsequently collapses when the solvents evaporate under ambient conditions (e.g., without supercritical drying). Liquid contaminants absorbed and trapped within the aerogel structure may also desorb during subsequent processing and interfere with the processing, such as forming additional layers on the aerogel. Similarly, saturated solvent vapors, condensing precursors from vapor deposited hard masks, and reactive plasmas from dry etch processes (e.g., when a hard mask or shadow mask is used) rapidly diffuse into the porous structure of the aerogel film to leave residues that increase the dielectric constant and/or cause densification and damage to the aerogel film. Moreover, it is a challenge to develop or strip the photoresist deposited directly on the surface of a polyimide aerogel film without causing damage to the porous structure of the underlying aerogel film. Alkaline resist developer solutions and wet and/or dry resist stripping processes may also attack the polyimide aerogel film due to poor selectivity between the photoresist and polyimide aerogel film, since both include organic materials. For example, an oxygen plasma used to strip a photoresist will also etch into the exposed edges and surface of the polyimide aerogel pattern. In addition, the polyimide aerogel pattern etch resolution is poor due to significant undercutting of resists that may occur due to diffusion by the wet and/or dry etchants into the porous structure of the aerogel film when removing the aerogel material to form a pattern. Such undercutting may cause delamination and/or liftoff of the patterned polyimide aerogel film. Similarly, ablative techniques may be utilized, such as etching using a UV (ultraviolet) laser, but may suffer from issues such as melting and/or delamination along the cut edges of the pattern, poor selectivity with underlying passivation layers, particle generation, redeposition of debris or soot, and/or damage to the underlying substrate from laser irradiation when large areas are ablated. Further, using contact masks in lieu of ablation, photoresists, and/or hard masks can easily cause mechanical damage to the surface of the porous aerogel film and other structures that may be present on the substrate surface, such as air bridges, wire bonds, and solder bumps. As a result, post-patterning of uniform aerogel films by removal of polyimide aerogel from a portion of the substrate while leaving the remaining portion of the polyimide aerogel intact to form a high quality aerogel pattern may be very difficult.

Further, significant stress may build up in uniform or substantially uniform aerogel films of more than a few microns in thickness when bonded to rigid substrates over large areas due to the inherent volumetric shrinkage that occurs during gelation and cure. This volumetric shrinkage stress may result in cracking and/or delamination of the aerogel film that may occur before, during, and/or after patterning. Forming the aerogel pattern additively avoids these problems associated with post-patterning and significantly reduces the risk of cracking by breaking the pattern into basic features having a smaller area.

Accordingly, embodiments of the present disclosure relate to compositions and methods for continuously dispensing an aerogel precursor (e.g., a polyimide prepolymer sol) in an additive patterning process such that the aerogel precursor may be gelled and cured to form an aerogel pattern, thereby reducing or eliminating a need to etch the aerogel to form the pattern. Compositions (e.g., polyimide prepolymer sols) according to embodiments of the present disclosure have good work life (e.g., a work life of greater than 4 hours, for example, a work life greater than or equal to 4 hours, 24 hours, 168 hours, or 336 hours, such as a work life in a range of 4 hours (or greater than 4 hours) to 336 hours), stable viscosity (e.g., a change in viscosity of less than +/−25% for at least 24 hours after being mixed), and the ability to rapidly form prepolymer gels upon, or subsequent to, contact with and wetting of a substrate, but not while sealed in the dispenser, and therefore, are capable of being continuously dispensed in a pattern (e.g., are capable of being selectively dispensed onto only a portion of a surface of a substrate in a continuous process via direct writing, micro-dispensing with a needle, jetting, and/or the like). For example, in some embodiments, the composition does not, or substantially does not, form a prepolymer gel while contained in a dispenser (e.g., a syringe, a cartridge, and/or the like) and/or clog a dispensing mechanism (e.g., a needle, nozzle, capillary, valve, pump, dispense head, and/or the like) of the dispenser.

Sols that include a dehydrating agent/imidization catalyst and/or crosslinking agent have a relatively shorter work life (e.g., a work life of a few minutes such as 30 minutes or less before they gel inside the dispenser reservoir (e.g., syringe and/or cartridge) and/or mechanism (e.g., a pump and/or needle). This leaves little time in the manufacturing process for transporting the sol to the dispenser, loading the dispenser, and dispensing the pattern of wet gel. Further, the sols that include a dehydrating agent/imidization catalyst and/or crosslinking agent have poor dispensability/micro-dispensability (e.g. excessive runniness or needle clogging), unstable viscosity (e.g., initially very low and then rapidly increasing viscosity), and unsuitable or uncontrolled evaporation leading to shrinkage, cracking, and/or collapse of the resultant wet gel pattern.

In some embodiments, formation of a polyimide aerogel film may proceed via two stages, a first stage at low temperature (e.g., room temperature to about 90° C.) to yield a stable intermediate, and a second stage at elevated temperature (e.g., a ramp from about 60° C. up to about 250° C.) to yield a final polyimide product. In the first stage, a mixture is reacted to form a soluble polyimide prepolymer sol having a stable, intermediate imide content to achieve viscosity suitable for dispensing, but without exceeding the critical point at which phase separation occurs spontaneously due to imide formation inside the dispenser. The prepolymer composition remains soluble while contained inside the closed dispenser reservoir (e.g., inside a closed syringe, dispense cartridge, etc.) and substantially protected from solvent loss, moisture absorption, and/or evaporation. However, by limiting the imide groups formed in the prepolymer sol to a portion including, for example, about 35% to 65% of the total polyimide prepolymer groups in the sol, the sol gels upon being dispensed (or soon after being dispensed) and does not require addition of a dehydrating agent, an imidization catalyst, and/or a crosslinker (e.g., a crosslinking agent having a functionality greater than two) to gel. For example, prepolymer sols of the present disclosure produce strong gels through phase separation upon contact and wetting of the substrate, without requiring concurrent (e.g., simultaneous) imidization and/or crosslinking, so that imidization can be completed by thermal curing of the prepolymer portion at a later stage, after the solvent has been removed from the gel. In contrast, wet gels from PAA sols including a dehydrating agent/imidization catalyst exhibit complete or substantially complete imidization and wet gels from PAA sols including a crosslinking agent (but not a dehydrating agent/imidization catalyst) exhibit incomplete or substantially incomplete imidization. Embodiments of the composition (e.g., the polyimide prepolymer sol) do not gel (or do not substantially gel) in the dispenser (e.g., the syringe and/or cartridge) in the first stage. For example, embodiments of the composition (e.g., the polyimide prepolymer sol) do not substantially gel in the dispenser and remain dispensable for a time period of at least 4 hours after being loaded to the dispenser.

In the second stage, the dispensed polyimide prepolymer sol gels to form a polyimide prepolymer gel (which may be self-supporting) that is dried and thermally cured to complete or substantially complete imidization of the polyimide prepolymer aerogel. By formulating the polyimide prepolymer sol to include a stable, intermediate state of imidization (thereby delaying complete or substantially complete imidization of the polyimide prepolymer sol until after dispense, gelation, and drying), the solubility, stability, and work life of the polyimide prepolymer sol are greatly improved, thereby enabling continuous or substantially continuous dispensing of the composition (or sol) for a direct write patterning process. Further, in contrast to the fully imidized and/or crosslinked PAA gels, wet gels formed from the polyimide prepolymer sol are reworkable and may be re-dissolved and/or washed away by covering the gelled pattern with a large excess of a polar, aprotic solvent. Mild heating (e.g., heating to a temperature less than or equal to 60° C.) of the solvent may be helpful to increase the solubility of the wet gels formed from the polyimide prepolymer sol and speed up dissolution of the prepolymer gel, but heating may not be necessary. In addition, this property facilitates cleanup of the dispense equipment for reuse, including cleanup of pumps, needles, and so on. Similarly, in the event that the dispense equipment does clog, for example if a dispense needle becomes plugged with gelled material at the tip due to solvent loss, the clog can easily be cleaned and/or prevented by periodically soaking the tip in a fresh bath of the solvent, which washes away and/or dissolves any gelled material. In some embodiments, a periodic tip soaking/cleaning procedure is incorporated as a preventive measure in an automated dispensing routine to facilitate continuous, high speed dispensing without clogging. A dispense tip that is coated or lined with a solvent-resistant, low surface energy material, such as PTFE (polytetrafluoroethylene) or other fluorinated polymer, may be utilized to further assist in preventing clogging or to facilitate easy removal of any gelled material from the dispense tip.

In some embodiments, a continuous or substantially continuous, direct writing method includes depositing a first film pattern of a wet gel prepolymer (e.g., by depositing the polyimide prepolymer sol, which includes a first solvent) onto a substrate at room temperature, reducing evaporation from the first film pattern by dispensing a second film of a second solvent (e.g., a low vapor pressure solvent, which may be the same as the first solvent) onto the first film pattern during a set time period (e.g. 2 minutes to 20 minutes after the first film is deposited) and before the first film pattern is substantially degraded by evaporation. A polyimide aerogel pattern may then be formed by removing the first and/or second films of solvent from the wet gel prepolymer of the first film pattern by super critical fluid extraction and then curing the prepolymer to form the polyimide aerogel. In some embodiments, the first and/or second solvents may be exchanged with a third solvent prior to supercritical fluid extraction. The third solvent is more miscible with supercritical $CO_2$ than either the first or second solvent.

Since embodiments of the present disclosure provide an additive aerogel patterning process, no set or predefined channels, trenches, pockets, molds, photoresists, lithographic masks, etch stops, and/or etch processes are required to form the polyimide aerogel pattern on the substrate. Further, masking and/or etching of substrate surfaces on which an aerogel film should not be formed, such as the on backside of the substrate, on flip chip bumps, on electrical interconnection pads and/or ground planes, is not required. In some embodiments, the substrates may be presented in substantially planar form, for example as a chip or wafer. However, unlike polyimide aerogel films that are cast, for example, by spin coating, doctor blading, and/or the like, and subsequently patterned lithographically using photoresists, there is no limitation or requirement for the sensitive regions or components to be coplanar or even on the same substrate in order to be patterned according to embodiments of the processes described in the present disclosure. For example, sensitive regions on the surface of components having different thickness or elevation mounted on the same substrate (e.g., components with different thickness or height on a circuit board assembly) or an array of separate components contained in a tray fixture may be patterned substantially without difficulty. For embodiments where sharply defined geometric features (e.g. vias, circles, edges, ovals, etc.) may be desired for fine-pitch or high density applications, the patterned aerogel film may be further trimmed or cut using a secondary patterning technique, such as, for example, laser ablation, to locally remove unwanted aerogel material from the patterned film to define a feature.

In some embodiments, three dimensional structures (3D) may protrude from the plane of the substrate such as, for example, the leads on the backside of a package, the air bridges on a MMIC, the solder bumps on a flip chip circuit, connectors and/or other components on a circuit board, and wire bonds on a chip-and-wire assembly. These 3D structures may prevent, interfere with, or be damaged by formation of polyimide aerogel patterns on sensitive regions elsewhere on the substrate when the patterns are formed by casting a uniform film of polyimide aerogel on the substrate and then post-patterning the film using lithographic techniques. Some 3D features, for example, air bridges or wire bonds on RF MMIC's, are easily damaged by the doctor blading or spin coating process. The 3D features may also cause voids or variations in the thickness of the deposited polyimide aerogel film and/or photoresist film that are difficult to adjust for during etching and, thus, result in poorly controlled etching in some areas. Further, some tall 3D structures, such as bond wires or ribbons, may mask or shadow the polyimide aerogel film or resist during lithography, resulting in poor etch resolution and defects. In contrast, according to embodiments of the processes described in the present disclosure, 3D structures can be accommodated without masking and without interfering with the additive patterning of polyimide aerogel on sensitive regions in other areas of the same substrate or assembly. This process flexibility allows the polyimide aerogel pattern to be applied after other assembly and/or fabrication operations that it may interfere with or be damaged by, such as metal deposition, wafer thinning, wafer via formation, wafer dicing, wafer cleaning, flip chip wafer bumping, pick and place mounting, solder reflow, flux cleaning, laminating, and/or wire bonding, are completed. In some embodiments, the polyimide aerogel pattern and, optionally, additional layers on the polyimide aerogel pattern are formed on discrete integrated circuits, after dicing and singulation of the semiconductor wafer. Further, the locations of the sensitive regions on a substrate or assembly need not be precisely fixed relative to one another and/or to the substrate to be patterned according to the process of the present disclosure. As no fixed mask is required, the polyimide aerogel pattern may be adjusted during deposition to compensate for variations in the placement, location, and/or height of multiple sensitive components or regions. In contrast to films that are cast, for example, by spin coating, doctor blading, spray coating, dip coating, and/or the like, the thickness of the polyimide aerogel pattern may also be adjusted from location to location by adjusting the dispensed volume to achieve different thickness of the pattern in different regions on the same substrate. In some embodiments, the sensitive regions to be encapsulated with the polyimide aerogel may include, for example, a 3D structure, such as an air bridge or wire bond, which may require that the aerogel film thickness be different relative to other sensitive regions on the substrate or tray. Such adjustments may be made, for example, by using automated or robotic dispense systems having an x-y-z positioning system (e.g., by utilizing a system having computer numerical control), vision recognition capability, and image processing routines that utilize edge detection and/or pattern matching to identify and locate the features of interest. In one embodiment, such a vision recognition system allows additive patterning of polyimide aerogel on an array of individual substrates and/or packages, for example, by sequentially indexing the dispenser over discrete integrated circuits and/or components contained in a fixture, such as a waffle pack or tray fixture having pockets.

Figure 4:
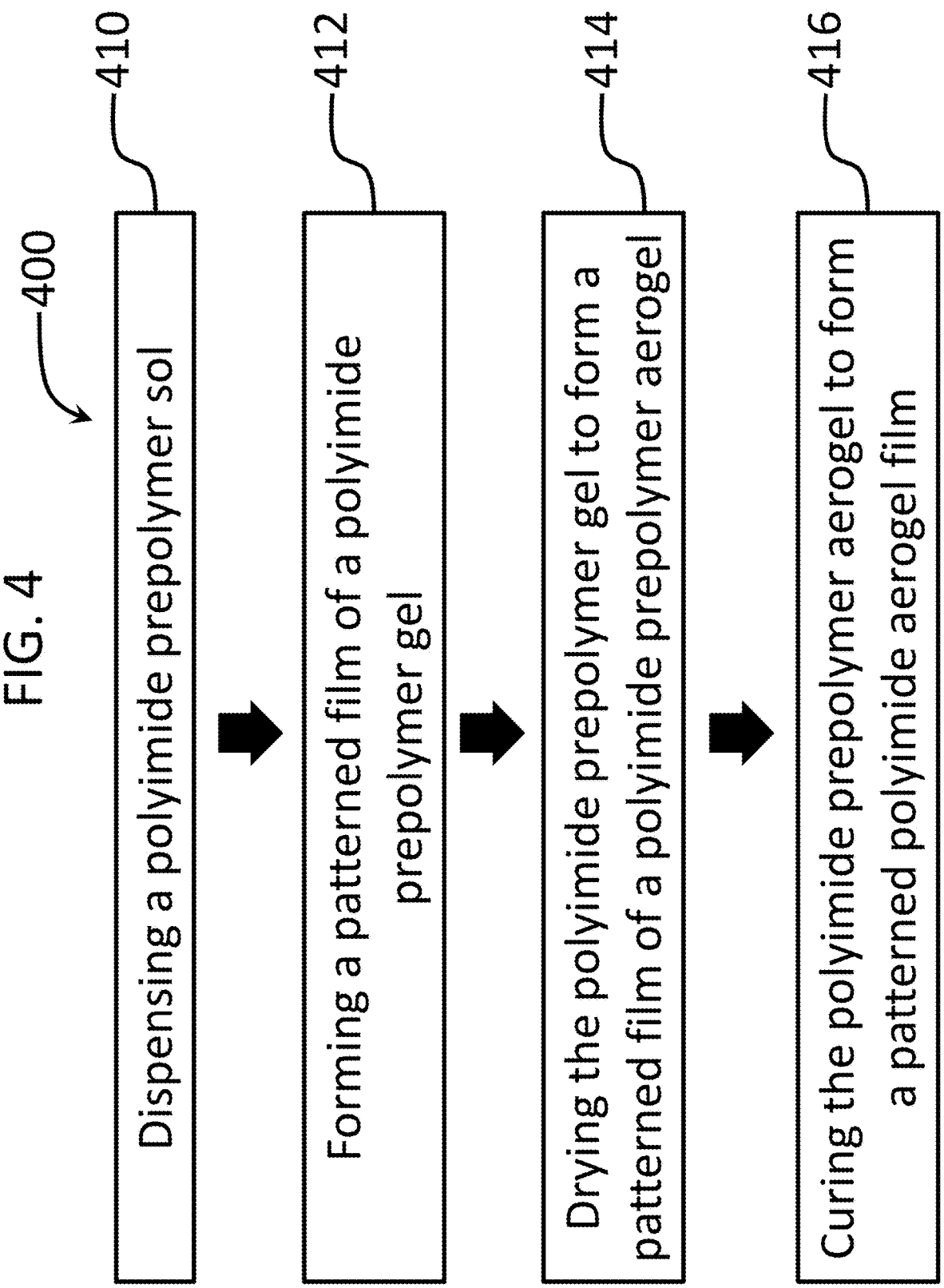
FIG. 4 is a flowchart illustrating an embodiment of a method for manufacturing a patterned polyimide aerogel film.

FIG. 4 is a flowchart showing an embodiment of (400) a method for manufacturing a patterned polyimide aerogel film on a substrate. The method shown in FIG. 4 includes (410) dispensing a polyimide prepolymer sol in a pattern. The polyimide prepolymer sol may be selectively dispensed onto a first portion of a surface of a substrate, a second portion (e.g., a remaining portion) of the surface of the substrate being substantially free of the polyimide prepolymer sol, which is in contrast to a film that is spin-coated, doctor bladed, and/or dip coated onto an entire or substantially entire surface of a substrate. As used herein, the expression "a second portion of the surface of the substrate being substantially free of the polyimide prepolymer sol" indicates that the polyimide prepolymer sol is only present on the second portion of the surface of the substrate, if at all, as an incidental impurity. In some embodiments, the second portion of the surface of the substrate is completely free of the polyimide prepolymer sol.

The method shown in FIG. 4 further includes (412) forming a patterned film of a polyimide prepolymer gel on the substrate from the pattern of polyimide prepolymer sol (e.g., by way of gelling the polyimide prepolymer sol); (414) drying the polyimide prepolymer gel to form a patterned film of a polyimide prepolymer aerogel on the substrate; and (416) curing the polyimide prepolymer aerogel on the substrate to form the patterned polyimide aerogel film on the first portion of the surface of the substrate, the second portion of the surface of the substrate being substantially free of the patterned polyimide aerogel film. Optionally, the method may further include laser etching the patterned film of the polyimide prepolymer aerogel on the substrate and/or laser etching the patterned polyimide aerogel film. As used herein, the expression "the second portion of the surface of the substrate being substantially free of the patterned polyimide aerogel film" indicates that the patterned polyimide aerogel film is only present on the second portion of the surface of the substrate, if at all, as an incidental impurity. In some embodiments, the second portion of the surface of the substrate is completely free of the patterned polyimide aerogel film.

Figure 5:
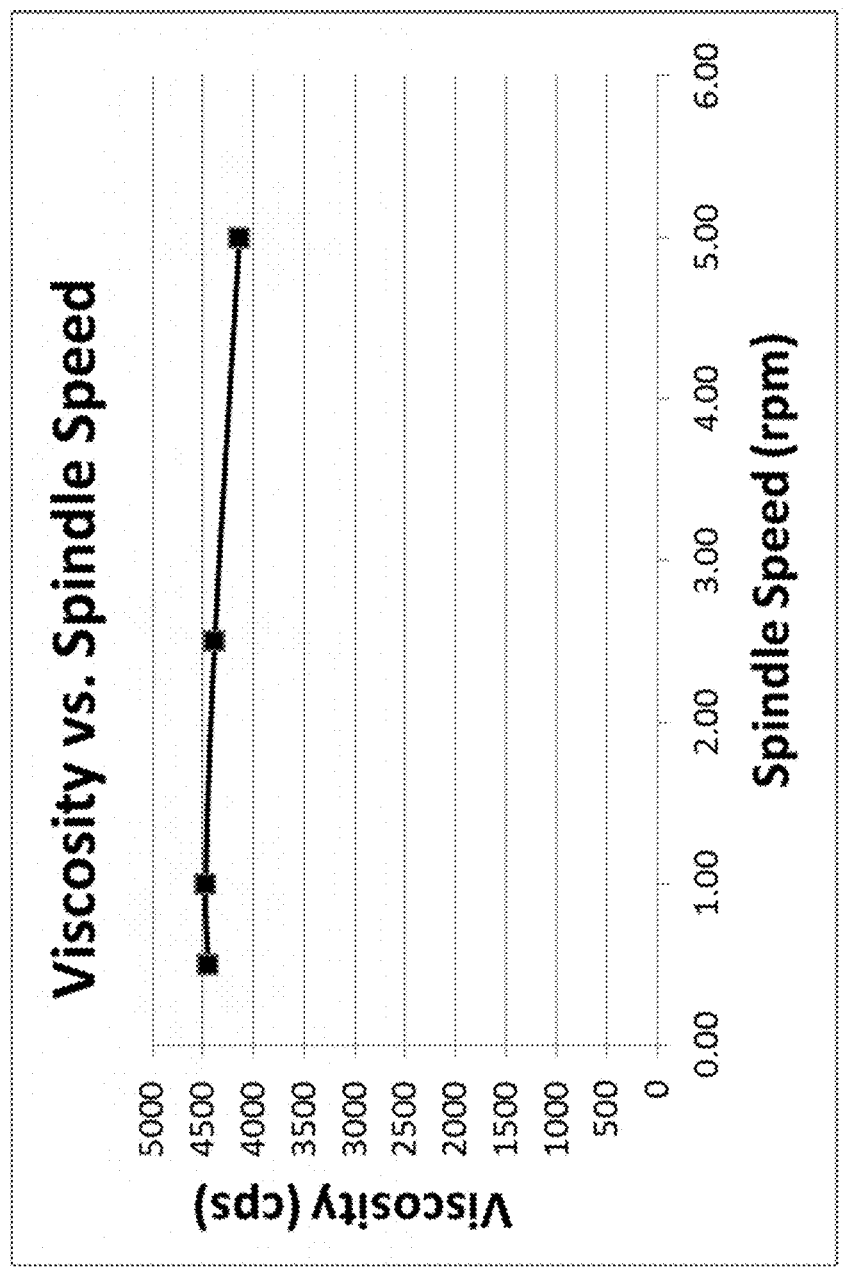
FIG. 5 is a graph showing Brookfield viscosity of an embodiment of a polyimide prepolymer sol.
Figure 6:
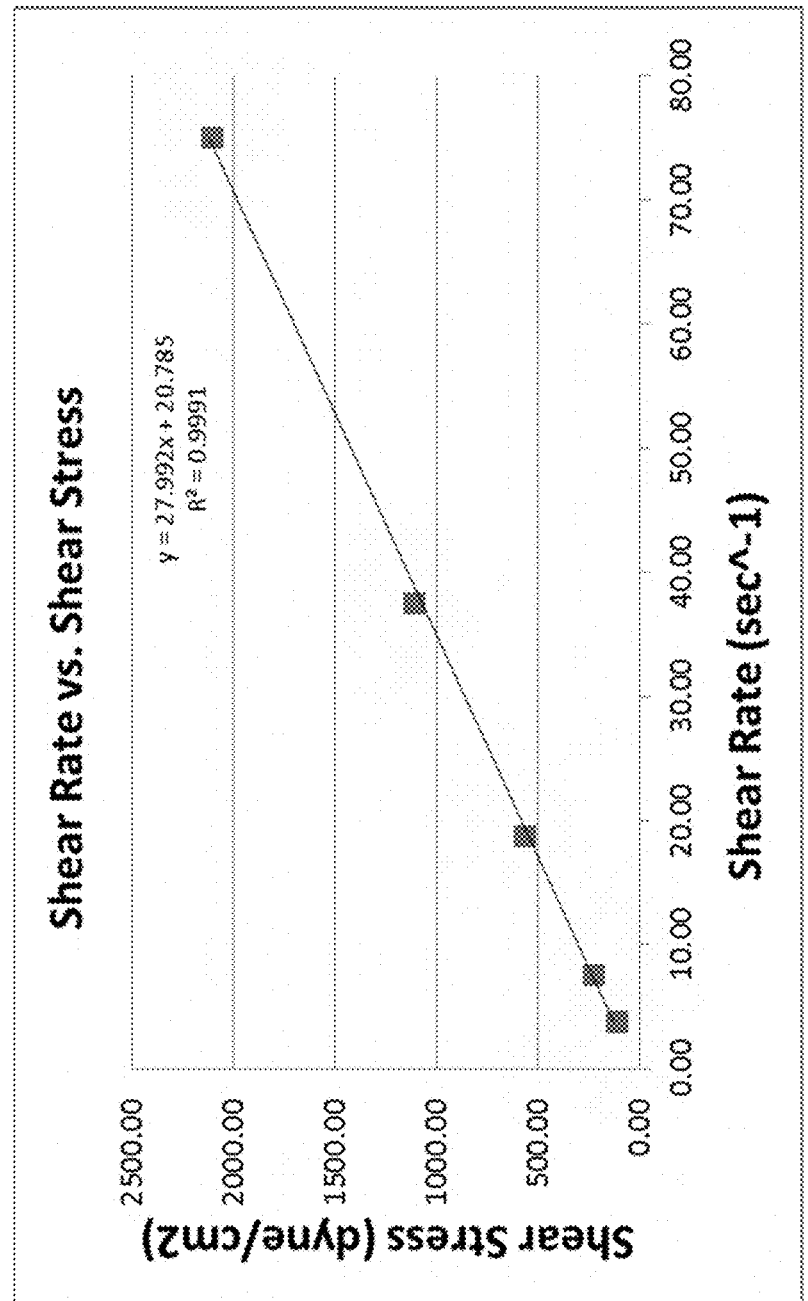
FIG. 6 is a graph showing a shear rate relative to a shear stress of an embodiment of a polyimide prepolymer sol.

The polyimide prepolymer sol may have a viscosity suitable for being dispensed (e.g., micro-dispensed utilizing a 27 gauge or higher gauge needle in volumes down to the nanoliter scale) and for forming a patterned film. The viscosity may be such that the prepolymer sol has adequate flow for strong wetting of the substrate and void-free encapsulation of sensitive features, such as air bridges, but still forms a self-supporting film while the prepolymer gels. For example, the polyimide prepolymer sol may exhibit a tailored viscosity and near-Newtonian fluid behavior (e.g., the sol flows freely and has a linear relationship between the shear stress and shear rate). Embodiments of the polyimide prepolymer sol have a Brookfield viscosity measured at 5 rpm and 25° C. that is stable (e.g., the viscosity changes by an amount less than or equal to +/−25%) for at least 24 hours after being mixed. In a sample prepared according to one embodiment, the polyimide prepolymer sol has a viscosity of 2071 centipoise (cps) soon after mixing, 2320 cps about 25 hours after mixing, and 1904 cps about 291 hours after mixing, when stored in a sealed dispense cartridge and/or vial at room temperature. For example, FIG. 5 is a graph showing Brookfield viscosity of an embodiment of a polyimide prepolymer sol. In some embodiments, the viscosity of the polyimide prepolymer sol is 1,000 centipoise (cps) to 20,000 cps or, for example, 1,000 cps to 5000 cps, or 2,500 to 4,500 cps at room temperature. For example, FIG. 6 is a graph showing a shear rate relative to a shear stress of an embodiment of a polyimide prepolymer sol. In this embodiment, the prepolymer sol demonstrates Newtonian fluid behavior having a linear relationship between shear stress and shear rate. In some embodiments, the polyimide prepolymer sol has a "thixotropic" or "shear thinning" index (e.g., a viscosity ratio calculated by dividing the viscosity measured at low rpm (e.g., 0.5 or 1.0 rpm) by that measured at 10× higher rpm (e.g., 5 rpm or 10 rpm, respectively)) of about 1.0 to about 1.5. For example, the thixotropic index for the embodiment of the polyimide prepolymer sol of FIG. 5 is about 1.1 when measured at 0.5 and 5 rpm. Sols within this thixotropic index range exhibit suitable or desired dispense and flow properties without balling up on the substrate and/or clogging the dispense needle. In contrast, sols that are about to gel or are partially gelled due to ongoing imidization and/or crosslinking exhibit pseudo-plastic behavior with significant shear thinning and flow occurring only after a large initial shear stress is applied to break up the gel. Such sols will exhibit a thixotropic index that is significantly greater than 1.5 and is variable.

Embodiments of the method may also further include dispensing the second solvent over the patterned film of the polyimide prepolymer gel in an amount suitable to compensate for the rate of evaporation of the first solvent from the polyimide prepolymer gel and to protect the polyimide prepolymer gel pattern from drying out. For example, the second solvent may be dispensed to protect the polyimide prepolymer gel pattern from evaporation while the wet gel is aged to gain strength before supercritical drying. This stage is particularly useful when dispensing patterns having small features of low volume (e.g., 1-10 nanoliters) and high surface area, for example, dots, from which solvent evaporation at room temperature is rapid even when a solvent having low vapor pressure is used. The second solvent may be dispensed before evaporation of the first solvent exposes the pores at the surface of the polyimide prepolymer gel, and the second solvent may be dispensed in a volume sufficient to cover the entire or substantially entire surface area of the polyimide prepolymer gel, but not in such excess that the polyimide prepolymer is dissolved and/or washed away. For example, the second solvent may be dispensed in a volume of about 2 to 2000 times the volume of the wet gel pattern or feature, which is sufficient to prevent damage to the gel due to solvent loss while the gel ages.

The first solvent and the second solvent may be a polar aprotic solvent and may be the same as or different from one another. Suitable first solvents will provide good solubility for both the starting monomer reactants and the resulting prepolymer. Non-limiting examples of the first, polar aprotic solvent include dimethyl sulfoxide (DMSO), N-methyl-2-pyrrolidone (NMP), N,N-dimethylacetamide (DMAC), N,N-dimethylformamide (DMF), hexamethylphosphoramide (HMPA), and propylene carbonate (PC). The first solvent may also include mixtures of two or more suitable solvents. Suitable second solvents will have a vapor pressure below about 1 mmHg at room temperature and will not cause substantial shrinkage, densification, degradation, swelling, and/or precipitation of the prepolymer gel. Non-limiting examples of the second solvent include DMSO, NMP, PC, and HMPA. When a longer handling time before supercritical fluid extraction is desired or required for the wet gel pattern and some additional shrinkage can be tolerated, low vapor pressure polyols may be utilized for the second solvent, including glycerol, ethylene glycol, and diethylene glycol. In some embodiments, a viscous second solvent, such as a glycerol, is selected with a viscosity of greater than 1,000 cps at about 20° C. for good or suitable dispensability and controlled or suitable wetting when covering the patterned film of the polyimide prepolymer gel. The second solvent may also include mixtures of two or more suitable solvents and may include a portion of a third solvent, described below.

In some embodiments, the first and/or second solvents may be exchanged with a third solvent that is more miscible with supercritical $CO_2$ than either the first or second solvent and is selected so that it will not cause rapid degradation, swelling, and/or precipitation of the imide and/or prepolymer groups within the prepolymer gel. The wet gel pattern may be washed in stages having increasing concentration of the third solvent in a mixture including the third solvent and the first and/or second solvent so that the third solvent is gradually introduced into the gel and the first and/or second solvent is gradually removed. In some embodiments, a series of washes (for example, four separate washes with fresh solvent) is performed using only the third solvent to remove as much of the first and/or second solvents as possible. Washing of the gel may also help remove unreacted monomers, catalysts, particles, and impurities so that they do not remain in the prepolymer gel when it is converted to the polyimide. In one embodiment, a three stage wash may include, for example, a mixture including 25% third solvent/ 75% second solvent, followed by a mixture including 75% third solvent/25% second solvent, followed by a final wash including 100% third solvent, with all percentages based upon the total solvent volumes. Non-limiting examples of suitable third solvents include those known in the art to be miscible with supercritical $CO_2$, for example, ultrapure alcohols such as methanol and ethanol. The third solvent may also include mixtures of two or more suitable solvents.

Figure 7:
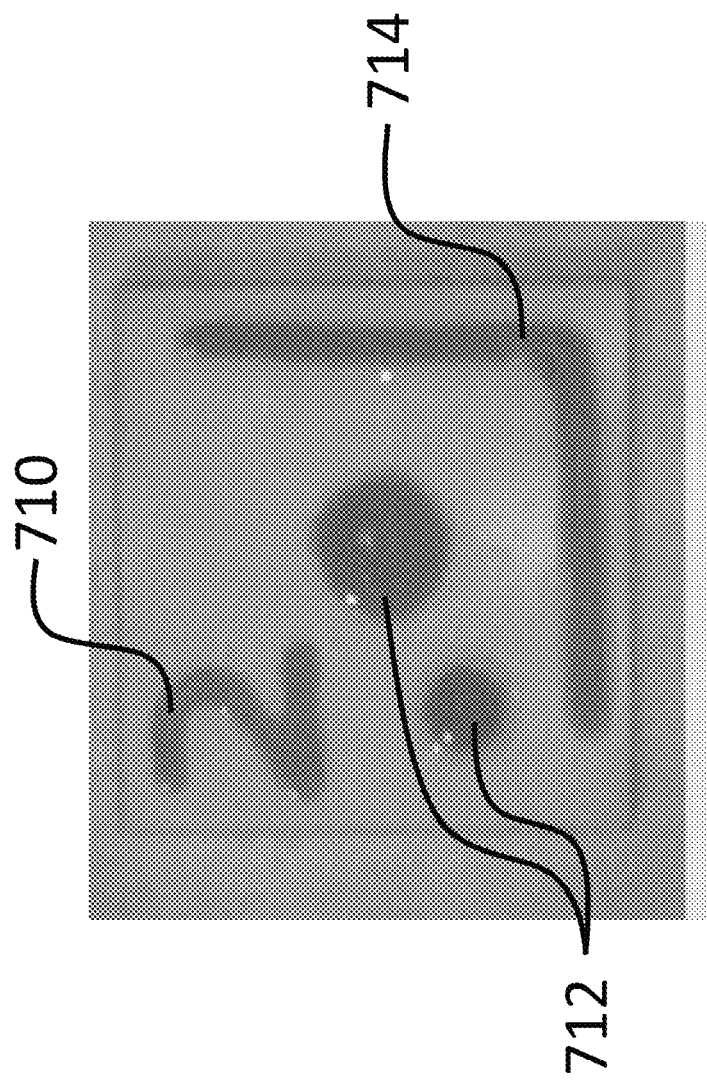
FIG. 7 is an image showing patterns of embodiments of the polyimide aerogel films.

In some embodiments, the dispensing includes dot dispensing, jetting, and/or free-form direct writing, and the dispensing may be performed by an automated system. For example, FIG. 7 is an image showing non-limiting examples of patterns (e.g., a set shape 710, droplets 712, and intersecting lines 714) of polyimide prepolymer wet gel films on an alumina substrate formed according to embodiments of the method. FIG. 8 includes a pair of images illustrating patterned polyimide aerogel films on a GaN flip chip device according to an embodiment of the method. In the left image of FIG. 8, the polyimide prepolymer sol has been dispensed in a pattern (e.g., droplets) that is then dried and cured to form polyimide aerogel films in the pattern (e.g., the droplets), which is shown in the right image of FIG. 8.

Because embodiments of the polyimide aerogel film sufficiently or suitably reduce the "dielectric loading" effects, any other layer on the polyimide aerogel film does not need to be designed to further reduce such "dielectric loading" effects (e.g., by having a dielectric constant tailored to further reducing such effects). Further, some embodiments of the polyimide aerogel film may have pore size distributions in the mesoporous range (e.g., in the range from about 2 to about 50 nanometers) with occasional macropores (e.g., pores with smallest dimension greater than about 50 nanometers in length) according to IUPAC classifications. Thus, additional layers formed on the polyimide aerogel film should be selected to be compatible with the pore sizes of the polyimide aerogel.

A composition (e.g., a polyimide prepolymer sol) according to embodiments of the present disclosure will now be described in more detail. Embodiments of the composition include a soluble, polyimide precursor formed from the reaction of diisocyanate, dianhydride, and tetracarboxylic acid monomers in the first solvent (e.g., the polar, aprotic solvent having low vapor pressure) in the presence of a small quantity of catalyst (e.g., a non-dehydrating catalyst such as, for example, a tertiary amine catalyst in a molar ratio of less than or equal to about 0.10:1 for the moles of the catalyst to the moles of the diisocyanate and/or the dianhydride) under anhydrous conditions with release of the $CO_2$ by-product to provide a dispensable sol having stable or substantially stable viscosity and long work life (e.g., a work life of greater than 30 minutes, for example, a work life greater than or equal to 4 hours, 24 hours, 168 hours, or 336 hours, or a work life of 4 hours (or greater than 4 hours) to 336 hours).

Although embodiments of the composition include a catalyst, the catalyst has a different amount (e.g., less than 10% mole percent of the diisocyanate and/or dianhydride versus a large molar excess), different composition (e.g., no dehydrating agent component), operates differently (e.g., facilitates isocyanate reactions to build/increase viscosity with loss of $CO_2$), and has a different effect than either a dehydrating agent/imidization catalyst (e.g., a dehydrating agent and pyridine imidization catalyst facilitates PAA ring closure with scavenging of $H_2O$ to form imide) and/or a crosslinking agent (e.g., a polyfunctional monomer that forms bonds across polymer chains). The large excess of the dehydrating agent/imidization catalyst utilized in other sols (e.g., 4:1, 5:1, 8:1, etc.) dilutes the sol and lowers initial viscosity of the sol so that the material exhibits unsuitable viscosity, rapid evaporation, and/or excessive runniness early during processing and then exhibits balling and/or lack of wetting when the sol is close to the gel point. Further, concurrent or simultaneous imidization and gelation of those sols causes short, rapid changes in polymer solubility and viscosity after dehydrating agent/imidization catalyst is added and a work life that is unsuitably or unsatisfactorily short (e.g., <30 minutes) for a continuous or substantially continuous dispense process and may also suffer from unsuitable or excessive evaporation and densification during dispensing, which affects the porosity of the final structure due to unsuitable or high shrinkage of the aerogel during gelation. Similarly, addition of a crosslinking agent (e.g., a triamine) has the effect of causing rapid gelation (e.g., within 1 minute or within 60 minutes), even without further imidization utilizing a dehydrating agent, so that the work life is unsuitable for a continuous dispense process. These limitations of sols including a dehydrating agent/imidization catalyst and/or crosslinking agent become even more pronounced for continuous micro-dispense processes that deposit nanoliter scale features (e.g., droplets of 1 to 10 nanoliters in volume) to form fine pitch patterns of aerogel on semiconductor wafers. According to embodiments of the present disclosure, the catalyst is included in the composition in a catalytic amount (e.g., 0.04:1 molar ratio of catalyst:dianhydride), while the dehydrating agent/imidization catalyst have been used in large excess (e.g., 5:1 to 8:1 molar excess).

Embodiments of the current disclosure benefit from the condensation reactions of diisocyanates with dianhydrides and tetracarboxylic acids in a single stage to form the polyimide prepolymer sol, which has good solubility and viscosity in the first solvent. The use of diisocyanate allows concurrent (e.g., simultaneous or substantially simultaneous) formation of both the imide portion of the sol and the prepolymer portion, wherein $CO_2$ gas is the only by-product of both reactions and is readily removed without use of a dehydrating agent/imidization catalyst during the first, low temperature stage of the process. For example, according to embodiments of the present disclosure, the composition is configured to directly form an imide group by a reaction of an isocyanate group (e.g., an isocyanate group of a diisocyanate) and an anhydride (e.g., a dianhydride), instead of indirectly forming an imide group by forming a precursor poly(amic acid), forming poly(amic acid), and then forming the imide group. The isocyanate and anhydride may react without a chemical or thermal dehydration reaction to directly form the imide group without forming an amic acid intermediate. The formation of a fixed and stable portion of imide groups is controlled by the amount of dianhydride versus tetracarboxylic acid utilized in the first stage of the process so that further imidization is substantially halted until the second, high temperature stage of the process is performed. The disclosed prepolymer sols gel upon dispense, so that no crosslinking agent is required to induce gelation. Some water is released during the final thermal curing stage to convert the dried prepolymer aerogel to the polyimide aerogel, but this water is readily removed by evaporation from the porous structure after the solvent is removed so that the prepolymer is not subjected to hydrolysis and/or attack by the released water. Since no dehydrating agent/imidization catalyst and/or crosslinking agent is added to the prepolymer sol in the first solvent, the viscosity remains stable. Thus, in some embodiments, the polyimide prepolymer sol, the polyimide prepolymer gel, the polyimide prepolymer aerogel, and/or the polyimide aerogel film is substantially free of dehydrating agents/imidization catalysts and/or crosslinking agents. As used herein, the expression "substantially free of dehydrating agents/imidization catalysts and/or crosslinking agents" indicates that dehydrating agents/imidization catalysts and/or crosslinking agents are only present in the referenced composition, if at all, as incidental impurities. In some embodiments, the polyimide prepolymer sol, the polyimide prepolymer gel, the polyimide prepolymer aerogel, and/or the polyimide aerogel film is completely free of dehydrating agents/imidization catalysts and/or crosslinking agents.

Any suitable catalyst, other than a dehydrating agent/imidization catalyst, capable of catalyzing a reaction of an isocyanate with a hydroxyl group, an anhydride and/or an acid may be used. Mixtures of catalysts may be utilized to improve reactivity by way of synergistic effects. In some embodiments, the catalyst may be a nucleophilic catalyst (e.g., a catalyst that facilitates nucleophilic attack on an isocyanate group of the diisocyanate, which may occur through formation of a complex between the catalyst and the isocyanate group, between the catalyst and a nucleophilic group of another reactant, or both). The catalyst may include a Lewis-base, an acyl transfer catalyst, and/or an amine-based catalyst.

In some embodiments, the catalyst includes a basic catalyst (e.g., a tertiary amine). For example, the catalyst may include a non-sterically hindered tertiary amine having a free electronic pair available on the nitrogen atom. Non-limiting examples of tertiary amine catalysts include triethylamine; dimethylbenzylamine (BMDA); triethylenediamine (TEDA or "DABCO"); and N,N-dimethylcyclohexylamine. Of these, dimethylbenzylamine is a good catalyst for ease of dispense in the small volumes utilized by embodiments of the disclosed method, good availability, good reactivity, and low vapor pressure (its concentration in the composition is fairly stable since it does not evaporate readily at room temperature). TEDA may be preferred if greater reactivity is required and/or if dispensing the catalyst into the composition in solid form is desired (TEDA is a solid at room temperature). Tertiary amines may be utilized in combination with organometallic compounds for a stronger, synergistic effect. For example, TEDA may be utilized in combination with an organometallic compound, such as stannous octoate and/or dibutyl tin dilaurate (DBTL), for a stronger catalytic effect than either catalyst used alone.

In some embodiments, the catalyst includes an organometallic compound and/or a metal salt. For example, the catalyst may include a tin-based compound. Non-limiting examples of the tin-based compound include stannous octoate, dibutyl tin dilaurate (DBTL), stannic chloride, and tin mercaptides, which exemplify these catalysts. Other base metals may be utilized, including bismuth, zinc, mercury, lead, nickel, cobalt, and/or iron. For example, bismuth nitrate, lead octoate, and/or zinc naphthenate may be utilized. Salts containing a cyanide ion, such as sodium cyanide, are useful for the anhydride-isocyanate reaction. Alkali metal salts of pyrrolidone, such as lithium pyrrolidone, and mono-alkali metal salts of dicarboxylic acids, such as mono-lithium salt of isophthalic acid, are also useful. Metal acetylacetonates, including Al, Co, Fe, Ni, and Zr are also catalytic to the diisocyanate-dianhydride reaction, while anhydrous hydrogen halides, such as dibutyltin dichloride, are catalytic to isocyanatecarboxylic acid reaction.

Figure 9:
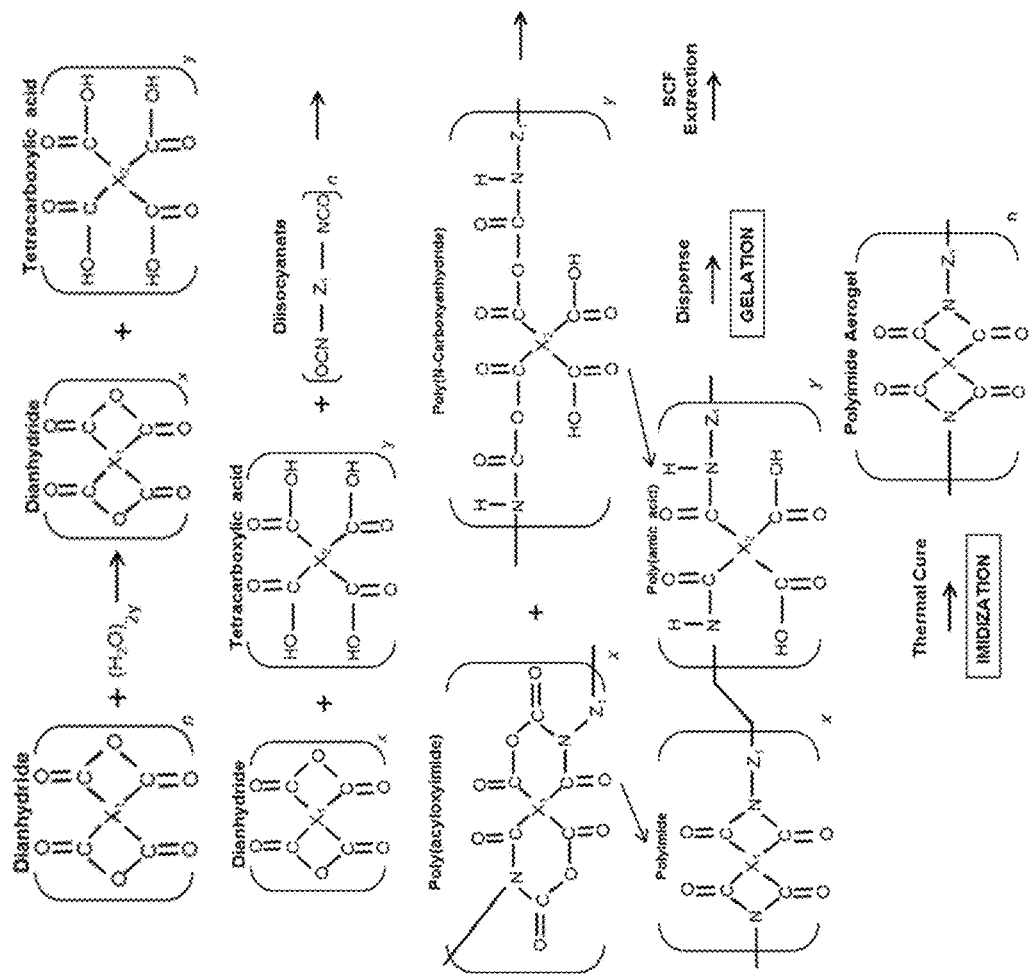
FIG. 9 is a flow chart showing a reaction scheme according to an embodiment of the present disclosure.

Embodiments of the composition may be utilized to prepare the polyimide aerogel film as shown in Reaction Scheme 1 of FIG. 9.

In some embodiments, in Reaction Scheme 1, x=n−y, y=0.35 n to 0.65 n (or 0.40 n to 0.50 n), and/or $X_1$ and $X_2$ are each independently a tetravalent organic group including at least two carbon atoms, and X represents the place held by either $X_1$ or $X_2$ in the polyimide product. $Z_1$ is a divalent organic group including at least two carbon atoms. For example, $X_1$, $X_2$, and $Z_1$ may each be independently selected from a substituted or non-substituted aromatic group, a substituted or non-substituted aliphatic group, a substituted or non-substituted cycloaliphatic group, a substituted or non-substituted heterocycloaliphatic group, and a substituted or non-substituted heteroaromatic group, and a combination thereof. $X_1$ and $X_2$ may be the same as or different from one another. In some embodiments, $X_1$, $X_2$, and $Z_1$ do not react and/or crosslink in the reactions according to Reaction Scheme 1 (e.g., $X_1$, $X_2$, and $Z_1$ may be unreactive or scarcely reactive with isocyanate groups, carboxyl groups, and/or carbonyl groups).

As can be seen in Reaction Scheme 1, a solution including a dianhydride and a tetracarboxylic acid is prepared. In some embodiments, the mixture may optionally be prepared by mixing the dianhydride in the solvent and adding water to hydrolyze a portion of the dianhydride to form a mixture including the dianhydride and the tetracarboxylic acid, wherein the dianhydride and the tetracarboxylic acid incorporate the same tetravalent organic group. This embodiment avoids the need to procure and store both the dianhydride and the tetracarboxylic acid independently. Hydrolysis of the dianhydride may be performed, for example, by mixing the dianhydride with 2y moles of water (where y=0.35 n to 0.65 n) in the reaction solvent at a temperature between about room temperature and about 90° C. for a period of 2 to 24 hours, prior to adding the diisocyanate. The amount of water already present in the solvent and/or the amount of the dianhydride that may have already been hydrolyzed by contact with humid air and/or storage should be taken into account when determining the amount of water to add to the dianhydride in the solvent. The catalyst (e.g., 0.04 n of the catalyst such as, for example, dimethylbenzylamine) may be added to a mixture including the dianhydride (represented by Formula 1) and the tetracarboxylic acid (represented by Formula 2) in DMSO solvent and the diisocyanate is then added to yield a solution having a solids content of 5% to 15% by weight. The resultant may be reacted (e.g., reacted at 25° C. for 0.1 hours to 0.5 hours) to prepare a poly(acyloxyimide) (e.g., a "seven-membered ring" cyclic intermediate) and a poly(N-carboxyanhydride) (e.g., a "mixed carbamic-carboxylic anhydride" intermediate).

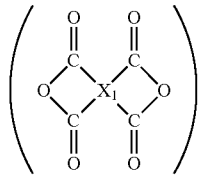

Formula 1

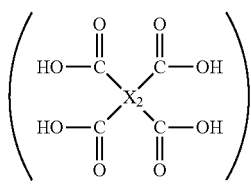

Formula 2

The poly(acyloxyimide) and the poly(N-carboxyanhydride) may be reacted (e.g., reacted at 25° C. to 90° C. for 0.5 to 24 hours) in a vented vessel under flowing nitrogen to evolve as much $CO_2$ as possible and to form a soluble polyimide prepolymer represented by Formula 3, where a may be 0.65 n to 0.35 n and b may be 0.35 n to 0.65 n, the polyimide prepolymer including a polyimide portion and a poly(amic acid) (e.g., the prepolymer) portion, where $X_1$, $X_2$, and $Z_1$ are the same as described with respect to Reaction Scheme 1:

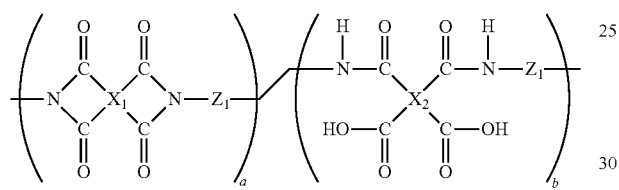

Formula 3

Figure 10:
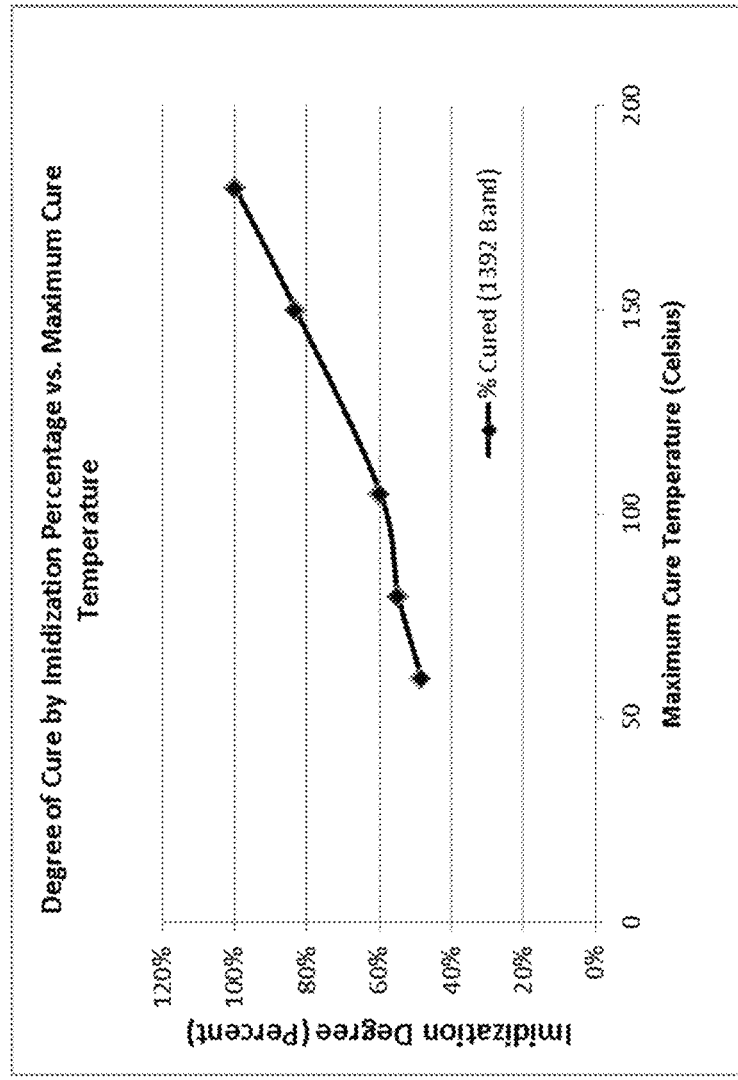
FIG. 10 is a graph showing the degree of imidization percentage of an embodiment of a polyimide aerogel film relative to a final curing temperature.

A composition (e.g., a polyimide prepolymer sol) including the polyimide prepolymer represented by Formula 3 may be dispensed (e.g., jetted, dispensed and/or micro-dispensed by a syringe, a nozzle, a needle, and/or a similar apparatus at, for example, a temperature of 25° C.) onto a substrate. Once dispensed on the substrate, the composition may then undergo gelation to form a wet gel, while the composition remaining inside the closed dispenser reservoir (e.g., syringe and/or dispense cartridge) remains soluble. In some embodiments, the dispensed prepolymer sol gels, for example, within 20 seconds, within 2 minutes, within 5 minutes, within 10 minutes, or within 20 minutes of being dispensed onto the substrate, while the prepolymer sol remaining in the closed dispense reservoir does not gel, for example, for greater than two weeks, 4 weeks, 6 weeks, or 3 months (e.g., the prepolymer sol remaining in the closed dispense reservoir does not gel for 4 weeks to 3 months). Further, the gelation stage may include covering the wet gel with a second, low vapor pressure solvent and a subsequent aging stage, wherein the wet gel is stored inside a sealed container (e.g., a glass jar) to limit solvent loss as the gel gains strength. In some embodiments, the wet gel may be aged, for example, for about 1 hour to about 24 hours (e.g., about for 1 hour, for 2 hours, for 12 hours, or for 24 hours) at room temperature. After partial, complete, or substantially complete gelation, the composition may be subjected to supercritical (SCF) extraction (e.g., SCF extraction utilizing supercritical $CO_2$) to yield the dry, prepolymer aerogel. In some embodiments, the SCF extraction may be preceded by a solvent exchange stage and followed by curing (e.g., thermal curing such as, for example, thermal curing including a temperature ramp or incremental stage cure from 60 to 250° C., 60 to 200° C., 60 to 175° C., or 60 to 150° C., over a period of 1 to 24 hours, followed by thermal curing at a curing temperature (e.g., the maximum curing temperature) for about 0.5 to 6 hours under nitrogen or vacuum). In an embodiment, the first stage of the thermal cure is performed gradually under vacuum in the range, for example, of 60 to 100° C., having stages at 60° C., 80° C., and 100° C., to remove solvent and further dry the prepolymer aerogel before substantial imidization occurs. The curing temperature (e.g., the maximum curing temperature) affects the degree to which the polyimide aerogel films are imidized. For example, FIG. 10 is a graph showing the degree of imidization of a dried polyimide aerogel pattern as a percentage relative to the maximum curing temperature of 200° C., as measured by monitoring the Imide II band of the Raman Spectrum at a wavelength of about 1388 $cm^{-1}$, while using the aromatic ring band at a wavelength of about 1612 $cm^{-1}$ as an internal standard. As can be seen in the graph of FIG. 10, the degree of imidization increases with an increase in the curing temperature (e.g., the maximum curing temperature).

The curing results in imidization of the polyimide prepolymer represented by Formula 3, which also produces $H_2O$, to prepare the polyimide aerogel. The polyimide aerogel may be represented by Formula 4, where X, $Z_1$, and n are the same as described with respect to Reaction Scheme 1:

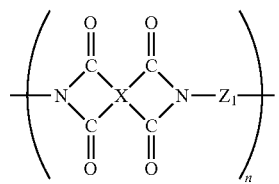

Formula 4

Figure 11:
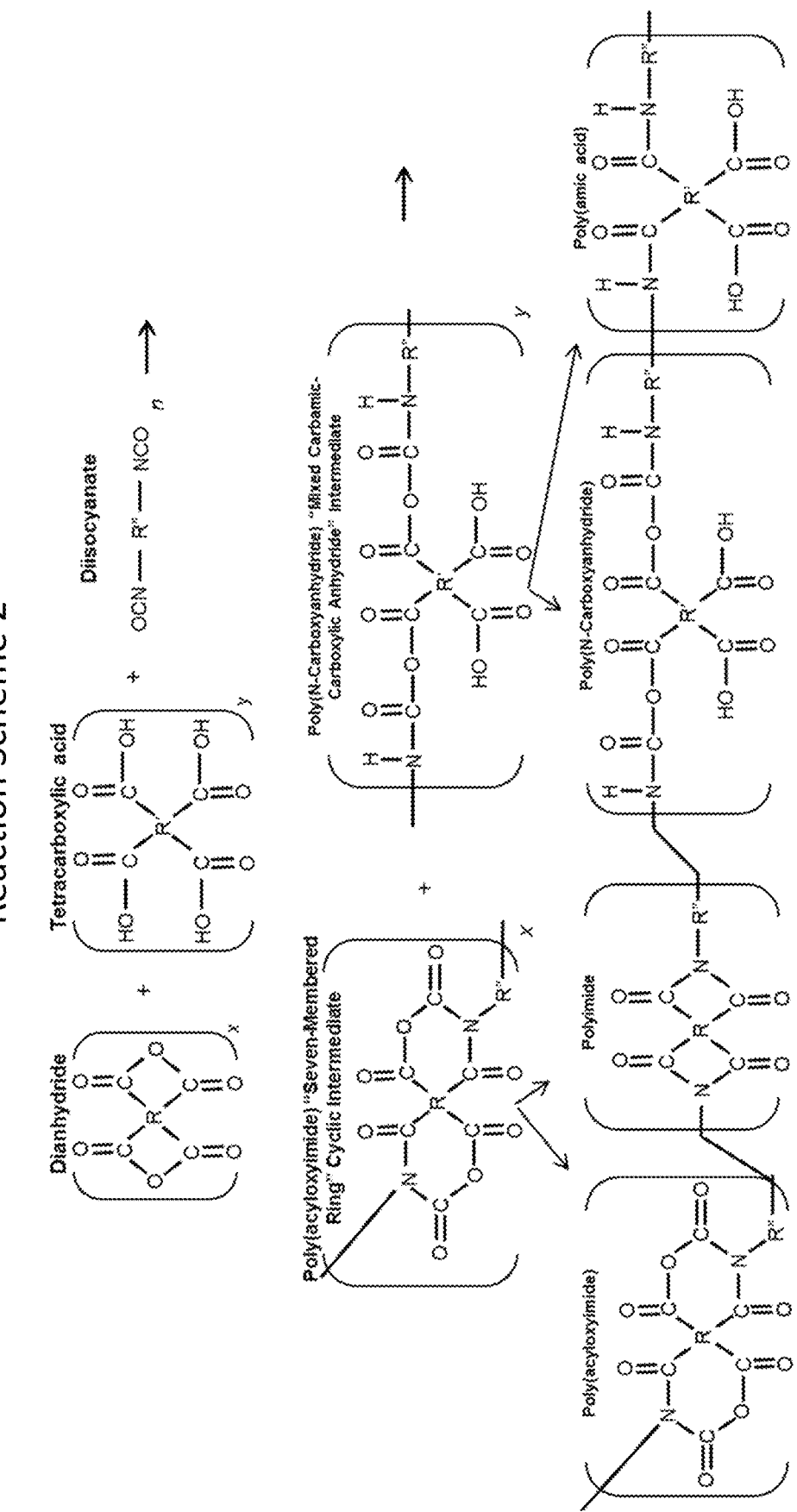
FIG. 11 is a flow chart showing a reaction scheme according to an embodiment of the present disclosure.

Reaction Scheme 1 represents complete or substantially complete reaction of the poly(acyloxyimide) and poly(N-carboxyanhydride) intermediates with loss of $CO_2$ to form the polyimide prepolymer of Formula 3. Complete or substantially complete reaction of the intermediates and evolution of 100% of the stoichiometric amount of $CO_2$ may be difficult to achieve under some reaction conditions, for example, when performing the reaction under mild conditions (e.g., extended reaction times at room temperature and/or with low catalyst content), when utilizing monomers having lower reactivity (e.g., those having sterically hindered functional groups), when utilizing a reaction vessel that is sealed or substantially sealed to avoid solvent loss and only opened periodically to prevent or reduce excessive $CO_2$ pressure buildup, and/or when transferring the prepolymer sol to the sealed dispense apparatus (e.g., cartridge and/or syringe) before the reaction is 100% complete. In particular, because decomposition of the intermediates (e.g., the poly(acyloximide) to the polyimide and the poly(N-carboxyanhydride to the poly(amic acid)) to form the polyimide prepolymer of Formula 3 produces $CO_2$, the degree of completion of the conversion is limited in a closed vessel and/or sealed syringe due to the accumulation of $CO_2$, which reduces the rate of decomposition, thereby maintaining a portion of the intermediates in a substantially unreacted form. Such prepolymer sols may exhibit higher solubility and lower viscosity than the fully reacted sols of Reaction Scheme 1. However, despite the presence of some unreacted intermediates, the prepolymer sols may still retain the desirable dispense, gel, and imidization characteristics consistent with fully reacted versions of Formula 3 because the intermediates are also soluble prepolymers that will complete conversion to the polyimide during the subsequent thermal curing of the prepolymer gel, except that $CO_2$ will be also released along with the usual $H_2O$ per Reaction Scheme 1. In some embodiments, the polyimide aerogel film may be prepared according to Reaction Scheme 2 of FIG. 11.

In some embodiments, in Reaction Scheme 2, x=n-y, y=0.35 n to 0.55 n, and/or R, R' and R" are each independently a tetravalent organic group including at least two carbon atoms. For example, R, R', and R" may each be independently selected from a substituted or non-substituted aromatic group, a substituted or non-substituted aliphatic group, a substituted or non-substituted cycloaliphatic group, a substituted or non-substituted heterocycloaliphatic group, and a substituted or non-substituted heteroaromatic group, and a combination thereof. R of the dianhydride and R' of the tetracarboxylic acid may be the same as or different from one another. In some embodiments, R, R' and R" do not react and/or crosslink in the reactions according to Reaction Scheme 2 (e.g., R, R' and R" may be unreactive or scarcely reactive with isocyanate groups, carboxyl groups, and/or carbonyl groups). As in Reaction Scheme 1, the tetracarboxylic acid may optionally be formed by hydrolyzing a portion of the dianhydride before adding the diisocyanate.

In Reaction Scheme 2, the catalyst (e.g., 0.05 n of the catalyst such as, for example, trimethylamine (TEA)) may be added to a mixture including the dianhydride (represented by Formula 5) and the tetracarboxylic acid (represented by Formula 6) in DMSO solvent, and the diisocyanate is then added to yield a solution having a solids content of 5% to 15% by weight. The resultant may be reacted (e.g., reacted at 25° C. for 0.1 to 0.5 hours) to prepare a poly(acyloxyimide) (e.g., a "seven-membered ring" cyclic intermediate) and a poly(N-carboxyanhydride) (e.g., a "mixed carbamic-carboxylic anhydride" intermediate).

Formula 5

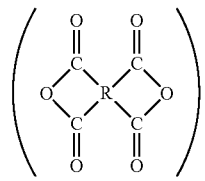

Formula 6

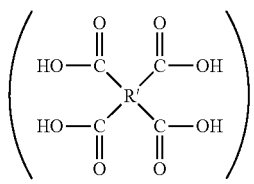

The poly(acyloxyimide) and the poly(N-carboxyanhydride) may be reacted (e.g., reacted at room temperature (e.g., 25° C. for 12 to 24 hours, for example, 12 hours) in a sealed vessel under nitrogen with periodic venting to release pressure buildup from evolved $CO_2$ and to form a polyimide prepolymer represented by Formula 7, the polyimide prepolymer including a poly(acyloxyimide) portion, a polyimide portion, a poly(N-carboxyanhydride) portion, and a poly(amic acid) portion, where, R, R', and R" are the same as described with respect to Reaction Scheme 2:

Formula 7

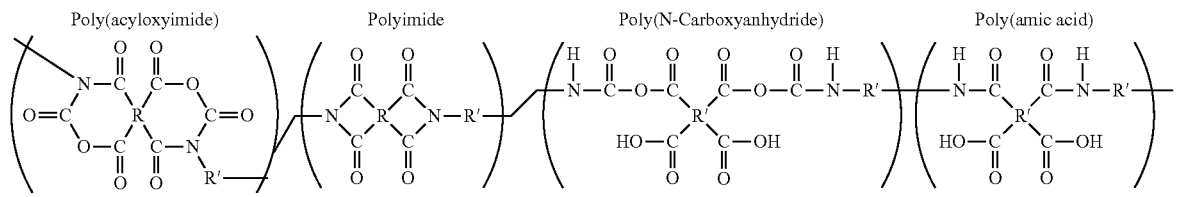

A composition (e.g., a polyimide prepolymer sol) including the polyimide prepolymer represented by Formula 7 may be dispensed (e.g., jetted, dispensed and/or micro-dispensed by a syringe, a nozzle, needle, and/or a similar apparatus at, for example, a temperature of 25° C.) onto a substrate. Once dispensed on the substrate, the composition may then undergo gelation to form a wet gel, while the composition remaining inside the closed dispenser reservoir (e.g., syringe and/or dispense cartridge) remains soluble. In embodiments, the dispensed prepolymer sol gels, for example, within 20 seconds, within 2 minutes, within 5 minutes, within 10 minutes, or within 20 minutes of being dispensed onto the substrate, while the prepolymer sol remaining in the closed dispense reservoir does not gel, for example, for greater than two weeks, 4 weeks, 6 weeks, or 3 months (e.g., the prepolymer sol remaining in the closed dispense reservoir does not gel for 4 weeks to 3 months). Further, the gelation stage may include covering the wet gel with a second, low vapor pressure solvent and a subsequent aging stage, wherein the wet gel is stored inside a sealed container (e.g., a glass jar) to limit solvent loss as the gel gains strength. In embodiments, the wet gel may be aged, for example, for about 1 hour to about 24 hours (e.g., about for 1 hour, for 2 hours, for 12 hours, or for 24 hours). After partial, complete, or substantially complete gelation, the composition may be subjected to supercritical (SCF) extraction (e.g., SCF extraction utilizing supercritical $CO_2$) to yield the dry, prepolymer aerogel. In some embodiments, the SCF extraction may be preceded by a solvent exchange stage and followed by curing (e.g., thermal curing such as, for example, thermal curing including a temperature ramp or incremental stage cure from 60 to 250° C., 60 to 200° C., 60 to 175° C., or 60 to 150° C., over a period of 1 to 24 hours, followed by thermal curing at the curing temperature (e.g., the maximum curing temperature) for about 0.5 to 6 hours under nitrogen or vacuum). In one embodiment, the first stage of the thermal cure is performed gradually under vacuum in the range, for example, of 60 to 100° C., having stages at 60° C., 80° C., and 100° C., to remove solvent and further dry the prepolymer aerogel before substantial imidization occurs. The curing results in imidization of the polyimide prepolymer of Formula 7, which also produces $CO_2$ and $H_2O$, to prepare the polyimide aerogel. The polyimide aerogel may be represented by Formula 8, where R'" represents the place held by either R or R' in the polyimide product, and R, R', R", and n are the same as described with respect to Reaction Scheme 2:

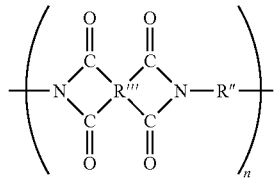

Formula 8

Controlling the surface wetting and kinetics of the gelation of the polyimide prepolymer sol (e.g., the polyimide prepolymer represented by Formulae 3 or 7) on the substrate may be useful in promoting gel formation, reducing perimeter cracking, and avoiding delamination of the final aerogel polyimide film. Good surface wetting by the sol, as indicated by a low wetting contact angle, brings the prepolymer in contact with the substrate and promotes adhesion. However, some substrates may exhibit such high surface energy and rapid wetting that the polyimide prepolymers in the sol are dispersed before substantial bonding and gelation can occur. This may result in thin, dense gels that exhibit cracking and/or delamination around the perimeter due to excessive solvent loss and shrinkage. Further, some substrates may exhibit poor wetting such that substantial gelation occurs before the film has wetted the substrate. These films may exhibit dewetting and/or "balling up" of the aerogel film due to the lack of wetting. Therefore, the substrate surface wetting and bonding should be characterized and balanced with the gelation kinetics to avoid cracking and ensure suitable or adequate adhesion of the film. In some embodiments, surface preparation and/or cleaning may be used to enhance surface wetting and bonding on the substrate by removing contaminants and/or activating the surface, for example, by exposure to UV ozone or plasma (e.g., a reactive plasma, such as oxygen, an inert plasma, such as argon, or a mixture of the two).

In some embodiments, the substrate surface to be patterned with the polyimide aerogel is a semiconductor (e.g., silicon (Si), gallium arsenide (GaAs), gallium nitride (GaN), silicon germanium (SiGe), and/or indium phosphide (InP)), a dielectric (e.g., silicon carbide (SiC), aluminum oxide ($Al_2O_3$), and/or aluminum nitride (ALN)), a metal (e.g., gold, copper, nickel, platinum, palladium, titanium, titanium-tungsten alloy, and/or aluminum metallization) and/or a semiconductor having an inorganic passivation layer (e.g., silicon dioxide ($SiO_2$), silicon nitride ($Si_3N_4$), silicon oxynitride ($Si_xO_yN_z$), titanium dioxide ($TiO_2$), and the like). Some inorganic substrates have high surface energy and may exhibit strong wetting by the sol when suitably or properly cleaned and/or activated. This may degrade the resolution and/or thickness of the of the dispensed prepolymer sol pattern due to excessive run out and/or may adversely affect the gelation kinetics. In addition, the inorganic surfaces may provide few chemically functional sites (e.g., amino, carboxyl, hydroxyl, etc.) for bonding of the prepolymer gel and the gel may exhibit poor adhesion despite strong wetting by the liquid sol. In such cases, surface treatment and/or modification may be utilized to control the wetting and promote adhesion of the prepolymer gel.

In some embodiments, substrates are treated with an organosilane coupling agent and/or adhesion promoter (e.g., by vacuum deposition, dip, and/or spin coating) that is optionally cured prior to deposition of the prepolymer sol to enhance control of the surface wetting, adhesion, and gelation of the wet film. Without being limited by any particular mechanism or theory, it is believed that the polyimide aerogel has a low density of bond sites for bonding to the substrate due to the porous structure of the polyimide aerogel. Thus, in some embodiments, the organosilane coupling agent and/or adhesion promoter substantially improves adhesion of the polyimide aerogel to the substrate by enhancing adhesion at the bonding sites that are available. Suitable organosilane coupling agents for preparing the substrate surface may include, for example, aminoalkylsilanes (e.g., 3-aminopropyltriethoxysilane, gamma-aminopropyltrimethoxysilane, bis(trimethoxysilylpropyl)amine, and aminophenyltrimethoxysilane), chloroalkylsilanes (e.g., ((chloromethyl)phenylethyl)trimethoxysilane)), isocyanatosilanes (e.g., 3-isocyanatopropyltrimethoxysilane), anhydride silanes (e.g., 3-(triethoxysilyl)propylsuccinicanhydride), azidosilanes (e.g., 6-azidosulfonylhexyltriethoxysilane), mercapto silanes (e.g., (3-mercaptopropyl)triethoxysilane), phosphine silanes (e.g., 2-(diphenylphosphino)ethyl-triethoxysilane), and the like. Such coupling agents allow controlled wetting and bonding of the prepolymer sol, as indicated by wetting contact angles for the dried aerogel/substrate interface that are greater than 5 degrees, but less than or equal to 90 degrees (e.g. less than 45 degrees, less than 30 degrees, or less than 20 degrees). The amount of the applied coupling agent is controlled to achieve a thickness on the order of a few monolayers and to limit the potential dielectric loading effect of the coupling agent on the substrate. In some embodiments, the organosilane is prepared by mixing a 0.1% to 1.0% solution by volume of an aminosilane in deionized water. The organosilane/water solution is then applied to the substrate for approximately 1 minute, blown off with dry nitrogen, and then cured for about 20 minutes at 115° C. In some embodiments, the organosilane is vapor deposited in a CVD process for more uniform thickness and coverage. Other organosilanes known in the art may also be used to treat the substrate surface and the surface may be solvent cleaned, baked (e.g., under vacuum), treated with UV ozone and/or a plasma (e.g., a reactive plasma, such as oxygen, an inert plasma, such as argon, or a mixture of the two) prior to treatment with the coupling agent to remove moisture and/or other contaminants, to ensure good wetting of the coupling agent for uniform coverage of the substrate, and to activate the substrate surface to further promote strong bonding and adhesion between the coupling agent and the substrate.

Additionally, any suitable layer may be included between the polyimide aerogel film and the substrate. For example, substrates that have high surface energy and/or poor bonding may be modified by depositing an intermediate dense, dielectric layer onto the substrate at any step prior to dispensing the prepolymer sol to provide better control of wetting characteristics (e.g., faster or slower wetting) and promote adhesion for the polyimide prepolymer aerogel. The dielectric layer may further be patterned to expose electrical contacts before dispensing the prepolymer sol. The prepolymer sol may then be selectively deposited over the dielectric layer and onto the sensitive regions or components, while leaving the electrical contacts exposed. Therefore, no further etching and/or removal of the dielectric layer would be required to form the polyimide aerogel pattern. Thus, the dense polymer dielectric layer serves as a permanent wetting and adhesion layer for the prepolymer sol, but is not required to define the final polyimide aerogel pattern.

The surface of the dense dielectric layer may be baked (e.g., under vacuum to remove moisture) and/or treated with a UV ozone process and/or plasma (e.g., a reactive plasma, such as oxygen, an inert plasma, such as argon, or a mixture of the two) prior to deposition of the prepolymer sol to enhance wetting and bonding. Further, in some embodiments, for example, where the dense dielectric layer comprises an inorganic film, the surface of the dense dielectric layer and any openings that expose the substrate surface may be treated with an organosilane coupling agent and/or adhesion promoter to further control wetting and gelation of the prepolymer sol. The organosilanes described herein and/or any other suitable organosilane coupling agent available in the art may be utilized with this method.

Non-limiting examples of the diisocyanates include aromatic diisocyanates such as methylenediphenyl 4,4'-diisocyanate (MDI), 3,3'-dimethyl-4,4'-diphenylene diisocyanate (o-Tolidine), 2,2-bis(4-isocyanatophenyl)hexafluoropropane, 3,3'-dichloro-4,4'-diisocyanato-1,1'-biphenyl, 4,4'-oxybis(phenyl isocyanate), 3,3'-dimethyldiphenylmethane-4,4'-diisocyanate, 3,3'-dimethoxy-4,4'-biphenylene diisocyanate, 1,3-phenylene diisocyanate, 1,4-phenylene diisocyanate, and 1,5-diisocyanatonaphthalene; and aliphatic diisocyanates, such as trimethyl-1,6-hexamethylene diisocyanate (THDI), isophorone diisocyanate, 1,4-diisocyanatobutane, hexamethylene diisocyanate (HDI), octamethylene diisocyanate, and m-tetramethylxylene diisocyanate. The diisocyanates may be used alone or in mixtures of two or more of them.

Non-limiting examples of the tetracarboxylic acid or the anhydride thereof include aromatic tetracarboxylic dianhydrides such as pyromellitic dianhydride (PMDA), 3,3'4,4'-benzophenone tetracarboxylic dianhydride, benzene-1,2,3,4-tetracarboxylic dianhydride, 2,2',3,3'-benzophenone tetracarboxylic dianhydride, 2,3,3',4'-benzophenone tetracarboxylic dianhydride, 4,4'-(hexafluoroisopropylidene)diphthalic anhydride, naphthalene-2,3,6,7-tetracarboxylic dianhydride, naphthalene-1,2,5,6-tetracarboxylic dianhydride, naphthalene-1,2,4,5-tetracarboxylic dianhydride, naphthalene-1,2,5,8-tetracarboxylic dianhydride, naphthalene-1,4,5,8-tetracarboxylic dianhydride, naphthalene-1,2,6,7-tetracarboxylic dianhydride, 4,8-dimethyl-1,2,3,5,6,7-hexahydronaphthalene-1,2,5,6-tetracarboxylic dianhydride, 4,8-dimethyl-1,2,3,5,6,7-hexahydronaphthalene-2,3,6,7-tetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, 1,4,5,8-tetrachloronaphthalene-2,3,6,7-tetracarboxylic dianhydride, 3,3',4,4'-diphenyl-tetracarboxylic dianhydride, 2,2',3,3'-diphenyl-tetracarboxylic dianhydride, 2,3,3',4'-diphenyl-tetracarboxylic dianhydride, 2,3'',4,4''-p-terphenyl-tetracarboxylic dianhydride, 2,2'',3,3''-p-terphenyl-tetracarboxylic dianhydride, 2,3,3'',4''-p-terphenyl-tetracarboxylic dianhydride, 2,2-bis(2,3-dicarboxyphenyl) propane dianhydride, 2,2-bis(3,4-dicarboxyphenyl)propane dianhydride, bis(2,3-dicarboxyphenyl) ether dianhydride, bis(3,4-dicarboxyphenyl) ether dianhydride, bis(2,3-dicarboxyphenyl)methane dianhydride, bis(3,4-dicarboxyphenyl)methane dianhydride, bis(2,3-dicarboxyphenyl) sulfone dianhydride, bis(3,4-dicarboxyphenyl) sulfone dianhydride, 1,1-bis(2,3-dicarboxyphenyl)ethane dianhydride, 1,1-bis(3,4-dicarboxyphenyl)ethane dianhydride, perylene-2,3,8,9-tetracarboxylic dianhydride, perylene-3,4,9,10-tetracarboxylic dianhydride, perylene-4,5,10,11-tetracarboxylic dianhydride, perylene-5,6,11,12-tetracarboxylic dianhydride, phenanthrene-1,2,7,18-tetracarboxylic dianhydride, phenanthrene-1,2,6,7-tetracarboxylic dianhydride and phenanthrene-1,2,9,10-tetracarboxylic dianhydride, and hydrogenated products thereof; alicyclic dianhydrides such as cyclopentane-1,2,3,4-tetracarboxylic dianhydride, cyclobutane-tetracarboxylic dianhydride, bicyclo[2,2,2]octa-7-en-2-exo,3-exo,5-exo,6-exotetracarboxylic acid 2,3:5,6-dianhydride and bicyclo[2,2,1]heptane-2-exo,3-exo,5-exo,6-exotetracarboxylic acid 2,3:5,6-dianhydride; and heterocyclic derivative dianhydrides such as pyrazine-2,3,5,6-tetracarboxylic dianhydride, pyrrolidine-2,3,4,5-tetracarboxylic dianhydride and thiophene-2,3,4,5-tetracarboxylic dianhydride. The dianhydrides may be used alone or in mixtures of two or more of them.

The amounts and compositions of the diisocyanate, dianhydride, and tetracarboxylic acid monomers may be adjusted to control the properties of the prepolymer sol and resultant polyimide aerogel film. Factors in selecting which monomers to select include cost, commercial availability, chemical form (e.g., fine powder versus coarse granules), flexibility of the backbone, shape of backbone (e.g., kinked, branched, and/or twisted versus planar), monomer reactivity (e.g., steric hindrance effects), polarizability of pendant groups, solubility in polar aprotic solvents, storage considerations, and long term stability in storage. Examples of properties of the prepolymer sol that may be adjusted through careful monomer selection include solubility, viscosity, flow, dispensability, gelation rate, and work life. Examples of properties of the resultant polyimide aerogel that may be adjusted include hydrophobicity and/or hydrophilicity (e.g., through polar and/or nonpolar pendant groups), toughness and/or cracking resistance, thermal stability (e.g., glass transition temperature (Tg)), degradation temperature, etc. of aliphatic versus aromatic monomers), CTE (e.g., CTE of rigid rod versus flexible monomers), density, dielectric constant, and loss tangent. For example, forming the composition utilizing a mixture of rigid and flexible diisocyanates reduces shrinkage of the resultant polyimide aerogel film and improves sol dispensability, film toughness, and resistance to cracking. Further, incorporating a small percentage (e.g., up to 25 mole percent) of an aliphatic monomer (e.g., trimethyl-1,6-hexamethylene diisocyanate, hexamethylene diisocyanate, and/or the like) having long, flexible chains extends solubility during dispense and greatly improves the flexibility, toughness, and cracking resistance of the polyimide aerogel films. In addition, increasing the content of diisocyanates, dianhydrides, and/or tetracarboxylic acids with flexible linkages and/or bulky pendant groups in the monomer backbone improves dispensability and flow of the prepolymer sol while decreasing premature gelling, stringing, and/or tailing of the gel. For example, incorporating monomers with kinked and/or twisted structures and nonpolar methyl (CH3) pendant groups helps improve solubility while also reducing aerogel film density, moisture uptake, and dielectric constant of the polyimide aerogel. Similarly, including a limited amount of monomers with fluorine pendant groups (e.g., adding up to 15 mole percent of 4,4'-(hexafluoroisopropylidene)diphthalic anhydride, based on the total moles of anhydride and tetracarboxylic acid in the composition) decreases electrical polarizability and dielectric constant, while dramatically increasing solubility and flow of the sol.

In some embodiments, the molar ratio of anhydride to the total moles of dianhydride and tetracarboxylic acid in the mixture is about 50% to about 55%. The diisocyanate may be utilized in a molar ratio of about 1.0 to about 1.05 to the total moles of the dianhydride and tetracarboxylic acid. In some embodiments, the anhydride/acid ratio, weight percent of solids, and catalyst content may be used to adjust the viscosity, gelation rate, and work life. In one embodiment, a diisocyanate mixture of methylenediphenyl 4,4'-diisocyanate, 3,3'-dimethyl-4,4'-diphenylene diisocyanate, and trimethyl-1,6-hexamethylene diisocyanate in a ratio of 45/47.5/7.5 mole percent, respectively, is reacted with a mixture of PMDA and its acid (PDMA/acid ratio of 54/46 mole percent, respectively) in a DMSO solution having an 8 weight percent solids content, a 0.04 molar ratio of benzyldimethylamine catalyst, and a 1.025 molar ratio of diisocyanate to the dianhydride/acid to provide a prepolymer sol with viscosity of 1,500 cps to 4,500 cps, thixotropic index of less than 1.2, and work life of greater than 40 hours. The prepolymer sol yields polyimide aerogel films with dielectric constant of 1.3 and loss tangent of 0.002 at 10 GHz on GaAs substrates having silicon nitride passivation.

Example 1: Preparation of Dispensable Polyimide Prepolymer Sol

The following reaction was carried out in a dry box purged with a continuous flow of dry nitrogen to form the polyimide prepolymer sol as follows. A threaded, 3 dram glass reaction vial was dried in an oven and cooled in dry nitrogen. Five milliliters (6,738.4 mg) of anhydrous DMSO were added to the vial along with 259.3 mg of PMDA (1.189 mmol). The PMDA was mixed until it dissolved and 20.0 mg of water (1.11 mmol, enough to hydrolyze about 46.7 mole percent of the anhydride groups) was added. The reaction vial was sealed with a polytetrafluoroethylene (PTFE) lined phenolic cap and the solution was mixed for 2 hours at room temperature. The cap was removed and o-Tolidine diisocyanate (152.2 mg, 0.5759 mmol) was added to the vial. After 5 minutes of mixing with the cap on, the o-Tolidine had dissolved. The cap was removed and MDI (136.6 mg, 0.5457 mmol) and THDI (18.1 mg, 0.0861 mmol) were added. Thus, the o-Tolidine, MDI, and THDI were added in a proportion of 47.7/45.2/7.2 mole percent and the total molar ratio of the diisocyanate to the dianhydride/acid was about 1.016. The solution contained about 8 wt % solids and was mixed for 1 minute with the cap on to dissolve the MDI. The cap was removed and BDMA catalyst (12.9 mg, 0.0951 mmol) was added. A parafilm seal was applied with a vent hole to allow $CO_2$ to escape from the reaction vial. The solution was mixed for 30 minutes and then allowed to stand for one day. The solution turned a deep amber color and became a viscous prepolymer sol. A portion of the prepolymer sol was poured into a 3 cc syringe and was easily dispensed through a 32 gauge needle without clogging. The prepolymer sol in the syringe remained dispensable for more than one week. The viscosity remained stable and was measured to be 4,138 cps at 5.0 rpm in a Brookfield viscometer at the end of 5 days after dispensing began.

Example 2: Forming Patterns of Polyimide Aerogel on Flip Chips

GaAs (2,000 μm×6,000 μm) and Si (3,600 μm×4,600 μm) flip chips were loaded to a metal tray fixture having pockets and prepared for patterning by baking for 15 minutes at 150° C., cleaning in an oxygen plasma, treating with 0.1% vol/vol solution of 3-aminopropyltriethoxysilane coupling agent in deionized water, and curing the coupling agent for 15 minutes at 130° C. The syringe of polyimide prepolymer sol from Example 1 (now aged approximately 48 hours after the final reactants were added) was used to dispense a pattern of two to four small dots (e.g., each dot was in the range of about 250-500 μm in diameter) of the prepolymer sol onto each die to cover the FET structures. After approximately 5 minutes, the dispensed dots of prepolymer sol had gelled. A second 3 cc syringe including a 30 gauge needle was prepared utilizing a few milliliters of propylene carbonate (PC) cover solution. The PC cover solution was dispensed over the pattern of wet gel dots onto each chip in sufficient volume to cover the entire (or substantially the entire) top surface of the chip, but without breaking over the edges. After aging the chips overnight in a sealed glass jar, the wet gel patterns were washed in baths of 75% DMSO/25% methanol, 25% DMSO/75% methanol, and 100% methanol for approximately 1 minute per stage. The wet gel patterns were then dried in supercritical $CO_2$ to yield the patterns of polyimide prepolymer aerogel. The dried polyimide prepolymer aerogel pattern on each chip was then cured for 3 hours at 70° C. and 2 hours at 90° C. under vacuum. The chips were then transferred to a nitrogen-purged oven and the cure was completed for 12 hours at 130° C., 3 hours at 160° C., and 0.5 hours at 170° C. The cured polyimide aerogel patterns were inspected and there were no signs of cracking or delamination from the chip surface. The cured aerogel dots on the chips each had a height of approximately 50-90 μm.

Polyimide aerogel films prepared according to embodiments of the present disclosure have been prepared to have properties as listed in the following Table 1:

TABLE 1

| Property | Range 1 | Range 2 |
|---|---|---|
| Dielectric Constant | <1.5 at 25° C. and 1 kHz-20 GHz | <1.3 at 25° C. and 1 kHz-20 GHz |
| Dissipation Factor | <0.005 at 25° C. and 1 kHz-20 GHz | <0.003 at 25° C. and 1 kHz-20 GHz |
| Density | <0.3 g/cm$^3$ | <0.15 g/cm$^3$ |
| Thickness | >8 μm (cover air bridges) | >50 μm |
| Thermal Stability | >220° C. for 60 seconds | >250° C. for 60 seconds |
| Dispensability | Repeatable dots having a diameter ≤10 mils | |
| Work Life (time to gel in syringe) | >4 hours | >96 hours |
| Shelf Life | 1 week in sealed vessel of syringe at room temperature | 2 weeks in sealed vessel of syringe at room temperature |
| Maximum Processing Temperature | ≤160° C. | ≤200° C. |

It is believed that polyimide aerogel films prepared according to embodiments of the present disclosure may have properties as listed in the following Table 2:

TABLE 2

| Property | Range 1 | Range 2 |
|---|---|---|
| Dielectric Constant | <1.3 at 25° C. and 1 kHz-20 GHz | <1.2 at 25° C. and 1 kHz-20 GHz |
| Dissipation Factor | <0.005 at 25° C. and 1 kHz-20 GHz | <0.0005 at 25° C. and 1 kHz-20 GHz |
| Density | <0.2 g/cm$^3$ | <0.15 g/cm$^3$ |
| Thickness | >8 μm (cover air bridges) | >15 μm |
| Breakdown Voltage | 0.03 MV/cm | |
| Shrinkage | <30% linear shrinkage | <20% linear shrinkage |
| Ionic Impurity Content | <200 ppm of Cl, <50 ppm each of Na, K, and F per Mil-Std-883, Method 5011 | |
| Thermal Shock | >100 cycles, −55° C. to +125° C. | |
| Thermal Stability | >250° C. for 60 seconds | >320° C. for 60 seconds |
| Dispensability | Repeatable dots having a diameter ≤10 mils | |
| Work Life (time to gel in syringe) | >4 hours | >96 hours |
| Shelf Life | >1 month in sealed vessel of syringe at −5° C. | >3 months in sealed vessel of syringe at −5° C. |
| Maximum Processing Temperature | <160° C. | <200° C. |

Figure 12:
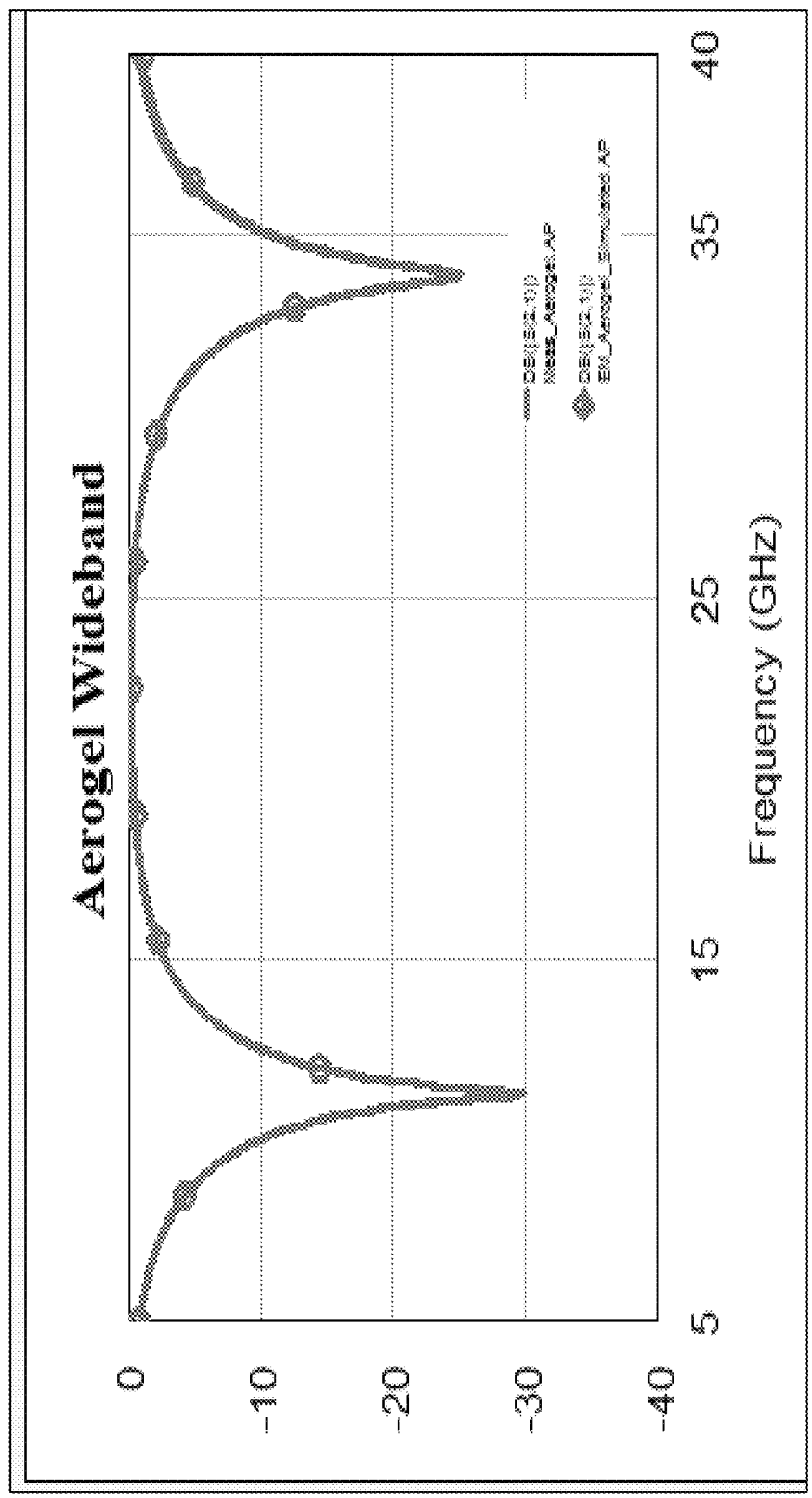
FIG. 12 is a graph showing a broadband model fit of an embodiment of a polyimide aerogel film.

The dielectric properties of the polyimide aerogel film may be measured as follows. An 11 GHz stub resonator on GaAs may be used to measure the effect of a 95 μm thick polyimide aerogel film. S-parameter measurements may be taken before and after coating. An Agilent Momentum EM simulator (available from Agilent, Santa Clara, Calif.) may be used to generate models that are fit to measured S21 data to determine an estimate (e.g., the best estimate) of the dielectric constant and loss tangent of the aerogel coating. The aerogel dielectric constant (k) may be iterated in a range of 1.0 to 2.0 increments of 0.1, and tan δ's may be iterated from 0 to 0.1 in increments of 0.0005. In one embodiment, a best model fit was obtained for k=1.3 and tan δ=0.002. For example, FIG. 12 is a graph showing a broadband model fit for k=1.3 and tan δ=0.002, where the model utilized concurrent fitting of location and depths of nulls at 11 GHz and 34 GHz. In the broadband model, the null location was determined by the dielectric constant and the null depth was determined by tan δ. Thus, embodiments of the polyimide aerogel film have a k value substantially lower than those of existing coatings or underfills such as $SiO_2$, $Si_3Ni_4$, benzocyclobutene (BCB), polyimide (non-aerogel), parylene, TEFLON AF, and Hysol FP4546, which have k values of 3.9, 7.5, 2.6, 3.0, 2.0, and 3.4, respectively. The high dielectric constants of those materials degrade MMIC performance, which further decreases as the dielectric constant increases and/or as the coating or underfill is made thicker.

Figure 13:
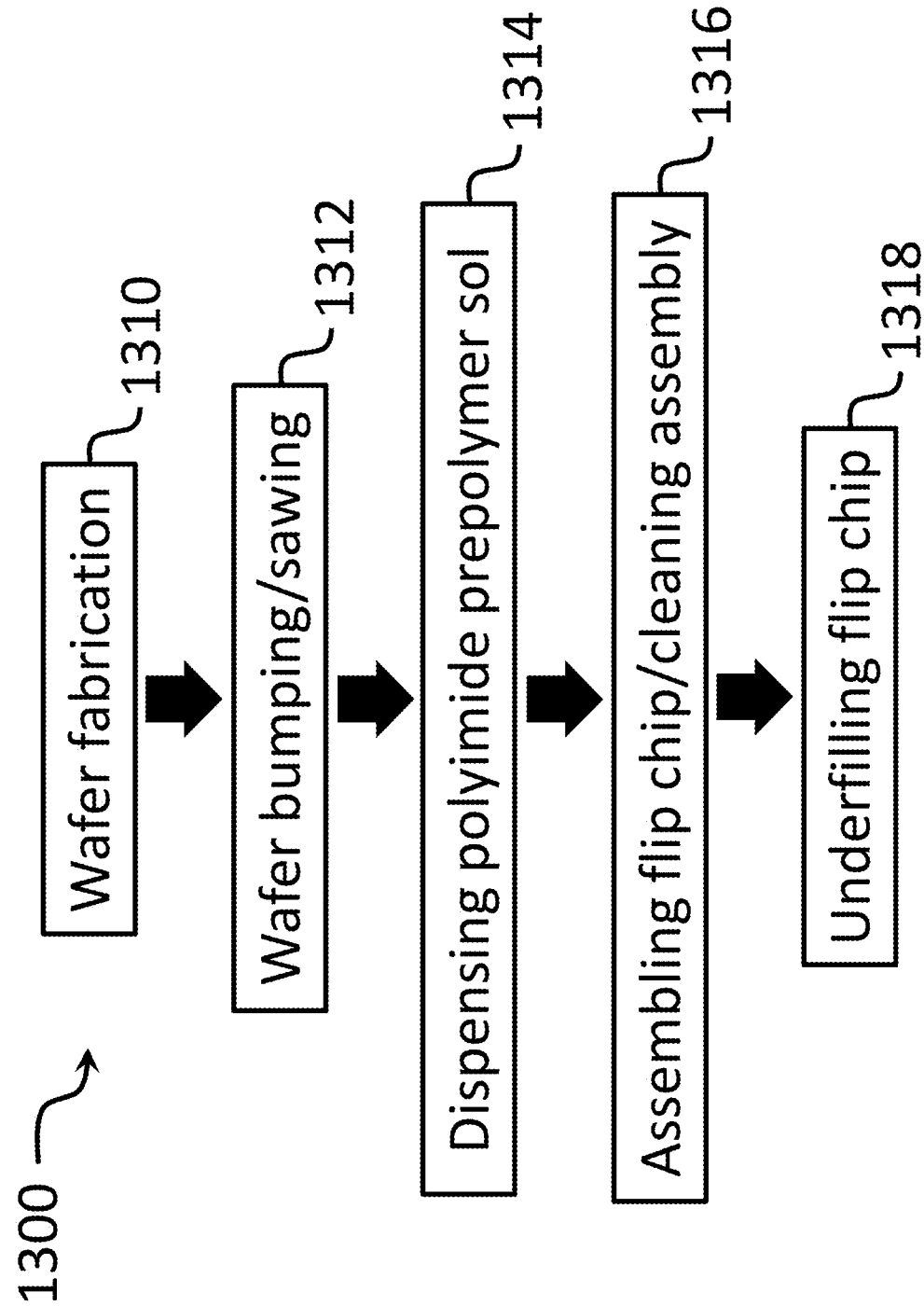
FIG. 13 is a flow chart showing an embodiment of a method of manufacturing a flip chip.

FIG. 13 is a flow chart showing an embodiment of a method of manufacturing a flip chip. In the embodiment shown in FIG. 13, (1300) a method of manufacturing a flip chip includes: (1310) fabricating a wafer; (1312) bumping and/or sawing the wafer to form a flip chip; (1314) dispensing the polyimide prepolymer sol on the flip chip to form the polyimide aerogel film; (1316) assembling the flip chip and cleaning the assembly; and (1318) underfilling the flip chip.

Figure 14:
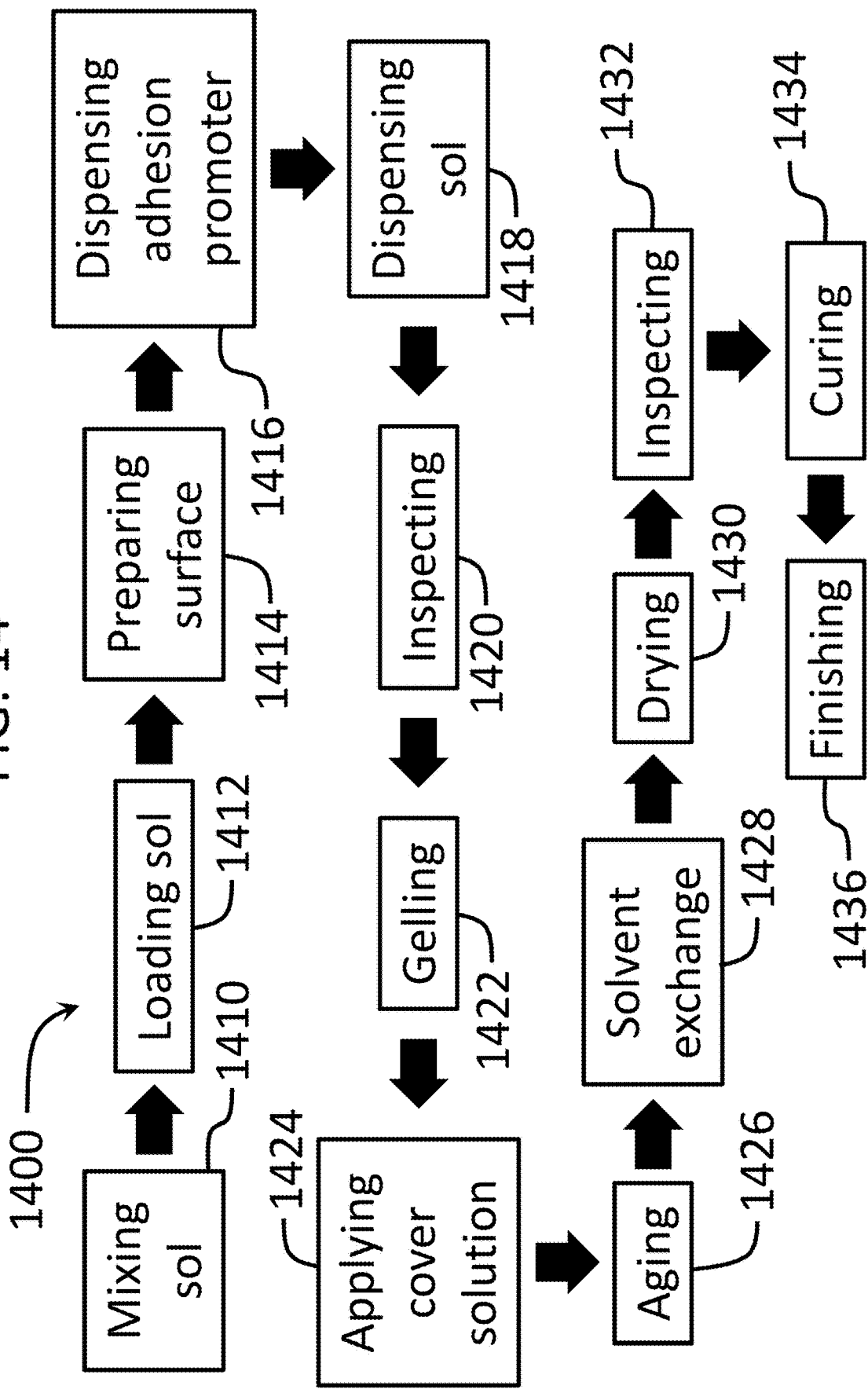
FIG. 14 is a flow chart showing an embodiment of a method of manufacturing a polyimide aerogel film.

FIG. 14 is a flow chart showing an embodiment of a method of manufacturing a polyimide aerogel film pattern on a component, such as a substrate, chip, and/or assembly (e.g., a hybrid chip and wire assembly). The embodiment of FIG. 14 is an example, and each of the acts shown in FIG. 14 may not be required to practice embodiments of the present disclosure. In the embodiment shown in FIG. 14, (1400) a method of manufacturing a polyimide aerogel film pattern includes: (1410) mixing the polyimide prepolymer sol; (1412) loading the sol (e.g., loading the polyimide prepolymer sol into a syringe and mounting the syringe on a dispenser); (1414) preparing the component surface utilizing a dehydration bake and oxygen plasma; (1416) dispensing an aminosilane adhesion promoter and optionally curing it; (1418) selectively dispensing the polyimide prepolymer sol in the desired pattern; (1420) inspecting the sol pattern (e.g., inspecting the pattern at 30× magnification and optionally washing it away with fresh solvent so process can be repeated if defects are found); (1422) gelling the polyimide prepolymer sol to form the polyimide prepolymer gel pattern; (1424) applying a cover solution over the prepolymer gel pattern (e.g., dispensing a controlled volume of low vapor pressure solvent over the pattern after a delay of about five minutes); (1426) aging the covered prepolymer gel pattern (e.g., storing overnight in a sealed container), (1428) performing solvent exchange with the polyimide prepolymer gel pattern (e.g., replacing the second solvent in the polyimide prepolymer gel with a third solvent in stages); (1430) drying the polyimide prepolymer gel pattern; (1432) inspecting the resultant polyimide prepolymer aerogel pattern; (1434) thermally curing the prepolymer aerogel pattern to form the polyimide aerogel pattern; and (1436) finishing the component (e.g., moving the components to the point of use for optional secondary patterning using laser ablation and/or forming additional layers and/or assembly).

The polyimide prepolymer sol according to embodiments of the present disclosure are compatible with methods for continuous or substantially continuous dispensing (e.g., compatible with dispensing equipment, such as needle dispensers and jet dispensers). According to embodiments of the present disclosure, a dispensable polyimide prepolymer sol refers to a polyimide prepolymer sol having a suitable viscosity that is stable over a desired timeframe (e.g., a timeframe compatible with continuous dispensing (e.g., 4 hrs or more after loading to the dispense equipment)). In some embodiments, a suitable viscosity is low enough to have mobility through dispensing equipment and/or not clog dispensing equipment, while being high enough to be self-supporting after being dispensed on a substrate. The term "self-supporting" in connection with embodiments of the present disclosure refers to the ability of the polyimide prepolymer sol to support its own weight during and after being dispensed while maintaining a suitable or desired pattern on a substrate. For example, the polyimide prepolymer sol according to embodiments of the present disclosure does not require molds, channels, pockets, trenches, and/or support structures to form the pattern and/or to constrain the pattern after being dispensed onto a substrate. Embodiments of the polyimide aerogel films may be applied in a pattern and do not require post-patterning. Also, embodiments are applied over areas smaller than those of spin-coated aerogels, which reduces cracking, as even polyimide aerogels may be prone to cracking when applied over large areas.

As used herein, the term "substantially," "about," and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification. Also, in the context of the present application, when a first element is referred to as being "on" a second element, it can be directly on the second element or be indirectly on the second element with one or more intervening elements interposed there between. Like reference numerals designate like elements throughout the specification.

While the present invention has been described in connection with certain embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method for manufacturing a patterned polyimide aerogel film on a substrate, the method comprising:
   forming a soluble polyimide prepolymer sol;
   loading the polyimide prepolymer sol to a sealed dispensing apparatus, the polyimide prepolymer sol having a viscosity of 1,000 to 20,000 centipoise over a time period of 168 hours or more and a gel time of 3 months or more;
   selectively dispensing the polyimide prepolymer sol in a pattern onto a first portion of a surface of a substrate, a second portion of the surface of the substrate not contacted and wetted by the dispensed polyimide prepolymer sol being substantially free of the polyimide prepolymer sol;
   forming a patterned film of a polyimide prepolymer gel on the substrate from the polyimide prepolymer sol, the polyimide prepolymer gel being self-supporting without further imidization and additively patterned by selectively dispensing the polyimide prepolymer sol in the pattern without predefined molds or photoresist;
   drying the polyimide prepolymer gel to form a patterned film of a polyimide prepolymer aerogel on the substrate; and
   curing the polyimide prepolymer aerogel on the substrate to complete imidization to form the patterned polyimide aerogel film on the first portion of the surface of the substrate, the second portion of the surface of the substrate not contacted and wetted by the dispensed polyimide prepolymer sol being substantially free of the patterned polyimide aerogel film.

2. The method according to claim 1, wherein the polyimide prepolymer gel is substantially free of dehydrating agents, imidization catalysts, and crosslinking agents.

3. The method according to claim 1, wherein the dispensing comprises dot dispensing, jetting, and/or free-form direct writing.

4. The method according to claim 1, wherein the polyimide prepolymer sol comprises a first solvent, and the forming of the patterned film of the polyimide prepolymer gel further comprises dispensing a second solvent over the patterned film of the polyimide prepolymer gel before evaporation of the first solvent exposes the pores at the surface of the polyimide prepolymer gel in an amount suitable to control a rate of evaporation of the first solvent from the polyimide prepolymer gel and to maintain the porous structure of the polyimide prepolymer gel pattern as the wet gel is aged for 1 to 24 hours, wherein the second solvent has a vapor pressure below about 1 mmHg at room temperature.

5. The method according to claim 4, wherein the first solvent comprises a polar aprotic solvent and the second solvent optionally comprises a solvent having a viscosity of greater than 1,000 cps.

6. The method according to claim 4, wherein the polyimide prepolymer sol is formed from a mixture comprising a diisocyanate, a dianhydride, and a tetracarboxylic acid.

7. The method according to claim 6, wherein the diisocyanate and dianhydride react to directly form an imide group and the imide group is formed in the polyimide prepolymer sol in an amount of about 35% to 65% of the total polyimide prepolymer groups in the sol by controlling an amount of the dianhydride and an amount of the tetracarboxylic acid in the mixture.

8. The method according to claim 6, wherein the dianhydride is represented by Formula 1, and the tetracarboxylic acid is represented by Formula 2:

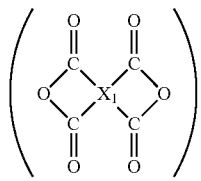

Formula 1

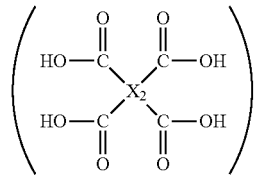

Formula 2 wherein, in Formulae 1 and 2, $X_1$ and $X_2$ are each independently a tetravalent radical comprising at least two carbon atoms.

9. The method according to claim 8, wherein $X_1$ and $X_2$ are each independently selected from a substituted or non-substituted aromatic group, a substituted or non-substituted aliphatic group, a substituted or non-substituted cycloaliphatic group, a substituted or non-substituted heterocycloaliphatic group, and a substituted or non-substituted heteroaromatic group, wherein the mixture is prepared by mixing the dianhydride in the first solvent and adding water to hydrolyze a portion of the dianhydride to form a mixture including the dianhydride and the tetracarboxylic acid, wherein the dianhydride and the tetracarboxylic acid include the same tetravalent radical.

10. The method according to claim 1, further comprising treating the surface of the substrate with an organosilane coupling agent, an adhesion promoter, or both, and curing, before the dispensing of the polyimide prepolymer sol.

\* \* \* \* \*